(12) United States Patent
Hwang et al.

(10) Patent No.: US 9,578,292 B2
(45) Date of Patent: Feb. 21, 2017

(54) DEVICE AND METHOD FOR TRANSMITTING/RECEIVING A PACKET IN COMMUNICATION SYSTEM

(71) Applicant: Samsung Electronics Co., Ltd., Suwon-si, Gyeonggi-do (KR)

(72) Inventors: Sung-Hee Hwang, Suwon-si (KR); Kyung-Mo Park, Seoul (KR); Sung-Ryeul Rhyu, Yongin-si (KR); Hyun-Koo Yang, Seoul (KR); Sung-Oh Hwang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 339 days.

(21) Appl. No.: 14/360,480

(22) PCT Filed: Nov. 23, 2012

(86) PCT No.: PCT/KR2012/009968
§ 371 (c)(1),
(2) Date: May 23, 2014

(87) PCT Pub. No.: WO2013/077662
PCT Pub. Date: May 30, 2013

(65) Prior Publication Data
US 2014/0314158 A1 Oct. 23, 2014

(30) Foreign Application Priority Data

Nov. 24, 2011 (KR) .................. 10-2011-0123878
Nov. 29, 2011 (KR) .................. 10-2011-0125885
Sep. 11, 2012 (KR) .................. 10-2012-0100522

(51) Int. Cl.
*H04L 13/00* (2006.01)
*H04N 19/00* (2014.01)
(Continued)

(52) U.S. Cl.
CPC ..... *H04N 7/26351* (2013.01); *H03M 13/2906* (2013.01); *H03M 13/618* (2013.01);
(Continued)

(58) Field of Classification Search
CPC ..... H04N 7/26351; H04L 1/004; H04L 1/007; H03M 13/2906
See application file for complete search history.

(56) References Cited

U.S. PATENT DOCUMENTS 7,454,683 B2 * 11/2008 Vesma et al. ......... H04L 1/0041
375/E7.279
7,610,544 B2 * 10/2009 Guo ..................... H04L 1/0052
714/776
(Continued)

FOREIGN PATENT DOCUMENTS

CN 1329426 A 1/2002
EP 2 842 253 A1 3/2015
(Continued)

OTHER PUBLICATIONS

Digital Video Broadcasting (DVB); Guidelines for the Implementation of DVB-IPTVPhase 1 Specifications; Part 3: Error Recovery; Sub-part 2: Application Layer—Forward Error Correction (AL-FEC); ETSI TS 102 542-3-2; May 2011; pp. 1-48, V1.3.2.
(Continued)

*Primary Examiner* — Esaw Abraham
(74) *Attorney, Agent, or Firm* — Jefferson IP Law, LLP

(57) ABSTRACT

The present invention relates to a device and method for transmitting/receiving a packet in a communication system. The present invention includes: the processes of determining at least one MPEG media transport (MMT) asset protected by an application layer forward error correction (AL-FEC); determining at least one FEC flow for transmitting the at least one MMT asset; determining the MMT asset transmit-
(Continued)

ted from the at least one FEC flow in each case and determining an FEC coding structure to apply to the at least one FEC flow; producing at least one source flow by dividing the MMT asset transmitted from the at least one FEC flow on a transmission unit basis; and producing and transmitting at least one parity flow by performing AL-FEC encoding on the at least one source flow according to the FEC coding structure.

7 Claims, 15 Drawing Sheets

(51) Int. Cl.
*H04L 1/00* (2006.01)
*H03M 13/29* (2006.01)
*H03M 13/00* (2006.01)
*H03M 13/11* (2006.01)
*H03M 13/15* (2006.01)
*H03M 13/35* (2006.01)
*H03M 13/37* (2006.01)

(52) U.S. Cl.
CPC ... *H03M 13/6356* (2013.01); *H03M 13/6362* (2013.01); *H04L 1/007* (2013.01); *H04L 1/008* (2013.01); *H04L 1/0017* (2013.01); *H04L 1/0041* (2013.01); *H04L 1/0075* (2013.01); *H04L 1/0083* (2013.01); *H03M 13/1102* (2013.01); *H03M 13/1515* (2013.01); *H03M 13/35* (2013.01); *H03M 13/3761* (2013.01); *H04L 1/0066* (2013.01)

(56) References Cited

U.S. PATENT DOCUMENTS

| | | | |
|---|---|---|---|
| 7,660,245 B1 | 2/2010 | Luby | |
| 7,864,805 B2* | 1/2011 | Hannuksela | H04L 65/608 370/473 |
| 8,543,893 B2* | 9/2013 | Hedaoo et al. | H03M 13/05 714/776 |
| 8,560,921 B2* | 10/2013 | Stockhammer | H04L 1/0041 714/762 |
| 8,705,639 B2* | 4/2014 | Salinger | H04N 19/80 375/259 |
| 2006/0029065 A1 | 2/2006 | Fellman | |
| 2007/0076708 A1 | 4/2007 | Kolakowski et al. | |
| 2007/0300127 A1 | 12/2007 | Watson et al. | |
| 2007/0300134 A1 | 12/2007 | Sugai et al. | |
| 2008/0134266 A1 | 6/2008 | Kang | |
| 2009/0185562 A1 | 7/2009 | Kannan et al. | |
| 2011/0010608 A1 | 1/2011 | Kim et al. | |
| 2011/0060974 A1 | 3/2011 | Viger et al. | |
| 2011/0219279 A1 | 9/2011 | Abu-Surra et al. | |
| 2011/0255558 A1 | 10/2011 | Hwang et al. | |

FOREIGN PATENT DOCUMENTS

| | | |
|---|---|---|
| KR | 10-2008-0047263 A | 5/2008 |
| KR | 10-2011-0005660 A | 1/2011 |
| KR | 10-2011-0117033 A | 10/2011 |
| WO | 2010-017836 A1 | 2/2010 |
| WO | 2013/162250 A1 | 10/2013 |

OTHER PUBLICATIONS

Park et al., "Working Draft of MPEG Media Transport", XP030018664, Aug. 24, 2011.
Park et al., "Working Draft of MPEG Media Transport", XP030019005, Jun. 7, 2012.
Youngkwon Lim, "Review of w11792", ISO/IEC JTC1/SC29/WG11 m 19989, Mar. 2011, Geneva Switzerland.
ITU-T (Telecommunication Standardization Sector of International Telecommunication Union), Content Delivery Error Recovery for IPTV Services, Series H: Audiovisual and Multimedia Systems, Recommendation ITU-T H.701, Mar. 2009, pp. 8, 9, 13-16, International Telecommunication Union.

* cited by examiner $$H = \begin{bmatrix} H_I & H_P \end{bmatrix}$$

$$= \begin{bmatrix} H_I & \begin{matrix} P & I & O & \cdots & O & O \\ O & I & I & \cdots & O & O \\ \vdots & O & I & \cdots & O & O \\ I & \vdots & \vdots & \cdots & \vdots & \vdots \\ \vdots & \vdots & \vdots & \cdots & I & O \\ O & O & O & \cdots & I & I \\ P & O & O & \cdots & O & I \end{matrix} \end{bmatrix}, \quad P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}_{L \times L}$$

FIG.15

DEVICE AND METHOD FOR TRANSMITTING/RECEIVING A PACKET IN COMMUNICATION SYSTEM

TECHNICAL FIELD

The present invention relates to a communication system, and more particularly to a device and a method for transmitting and receiving a packet.

BACKGROUND ART

Increase of various content, and increase of content of great quantity such as a high definition (HD) content, and a ultrahigh definition (UHD) content causes data congestion to be gradually increased in a network. In this condition, contents transmitted by a sender, e.g., a host A, is not normally transmitted to a receiver, e.g., a host B, and some of the contents may be lost in a route. Generally, since data is transmitted by a unit of a packet, loss of the data occurs by a unit of a packet. Accordingly, since the receiver cannot receive the packet due to the loss of the data, it is impossible to identify the data in the lost packet. Therefore, it causes deterioration of audio quality, degradation of video image quality or an image breaking, an omission of an insert title, a loss of a file and the like making an inconvenience for a user. For reasons of the above description, a method of recovering the loss of the data occurring in the network is required.

DISCLOSURE OF INVENTION

Technical Problems

The present invention has been developed to solve the above-mentioned problem in the conventional art, and an aspect of the present invention is to provide a device and a method for recovering a data loss occurring in a network.

Further, another aspect of the present invention is to provide a method of transmitting an MPEG media transport (MMT) asset, in which a FEC flow is configured and an AL-FEC is managed in order to transmit an MPEG media transport (MMT) package protected by an application layer forward error correction (AP-FEC), i.e., an FEC flow.

Means to Solve the Problem

In accordance with an aspect of the present invention, a method of transmitting a packet in a communication system is provided. The method includes: determining at least one MPEG Media Transport (MMT) asset which is protected by an application layer forward error correction (AL-FEC); determining at least one FEC flow in order to deliver the at least one MMT asset; determining an MMT asset delivered from the at least one FEC flow, and determining an FEC coding structure to be applied to the at least one FEC flow; generating at least one source flow by dividing the MMT asset delivered from the at least one FEC flow by a unit of delivering the MMT asset; and performing an AL-FEC encoding for the at least one source flow according to the FEC coding structure, so as to generate and deliver at least one parity flow.

In accordance with another aspect of the present invention, a method of receiving a packet in a communication system is provided. The method includes: receiving a forward error correction (FEC) flow message from a sender; identifying a number of FEC flows and an FEC coding structure applied to each FEC flow from the FEC flow message; classifying FEC flows from an MMT packet received from the sender; and performing an FEC decoding for each of the classified FEC flows based on an FEC coding structure.

In accordance with still another aspect of the present invention, a device for transmitting a packet in a communication system is provided. The device includes: a controller which determines at least one MPEG Media Transport (MMT) asset protected with an application layer forward error correction (AL-FEC), determines at least one FEC flow for delivering the at least one MMT asset, determines an MMT asset delivered from the at least one FEC flow, and determines an FEC coding structure applied to the at least one FEC flow; and a coding unit which divides the MMT asset delivered from the at least one FEC flow by a unit for a delivery to generate at least one source flow, and preforms an AL-FEC encoding for the at least one source flow according to the FEC coding structure to generate and delivery at least one parity flow.

In accordance with still another aspect of the present invention, a device of receiving a packet in a communication system is provided. The device includes: a receiving unit which receives a forward error correction (FEC) flow descriptor; a controller which identifies a number of FEC flows from the FEC flow message and an FEC coding structure applied to each FEC flow, and classifies the FEC flows from an MMT packet received from the sender; and a decoding unit which performs an FEC decoding for each of the classified FEC flows based on the FEC coding structure.

Advantageous Effects

According to the present invention, the sender provides a mechanism which protects the MMT flow based on QoS of the MMT Asset included in the MMT flow in the MMT package. It also transmits description information on the FEC flows to the receiver so that the receiver can identify the description information on the FEC flows through the received packets in advance. Accordingly, the receiver can effectively decode the received MMT packet.

BRIEF DESCRIPTION OF DRAWINGS

FIGS. 13 and 15 are views illustrating a process of generating a parity block by using a parity symbol according to the embodiment of the present invention.

BEST MODE

Figure 1:
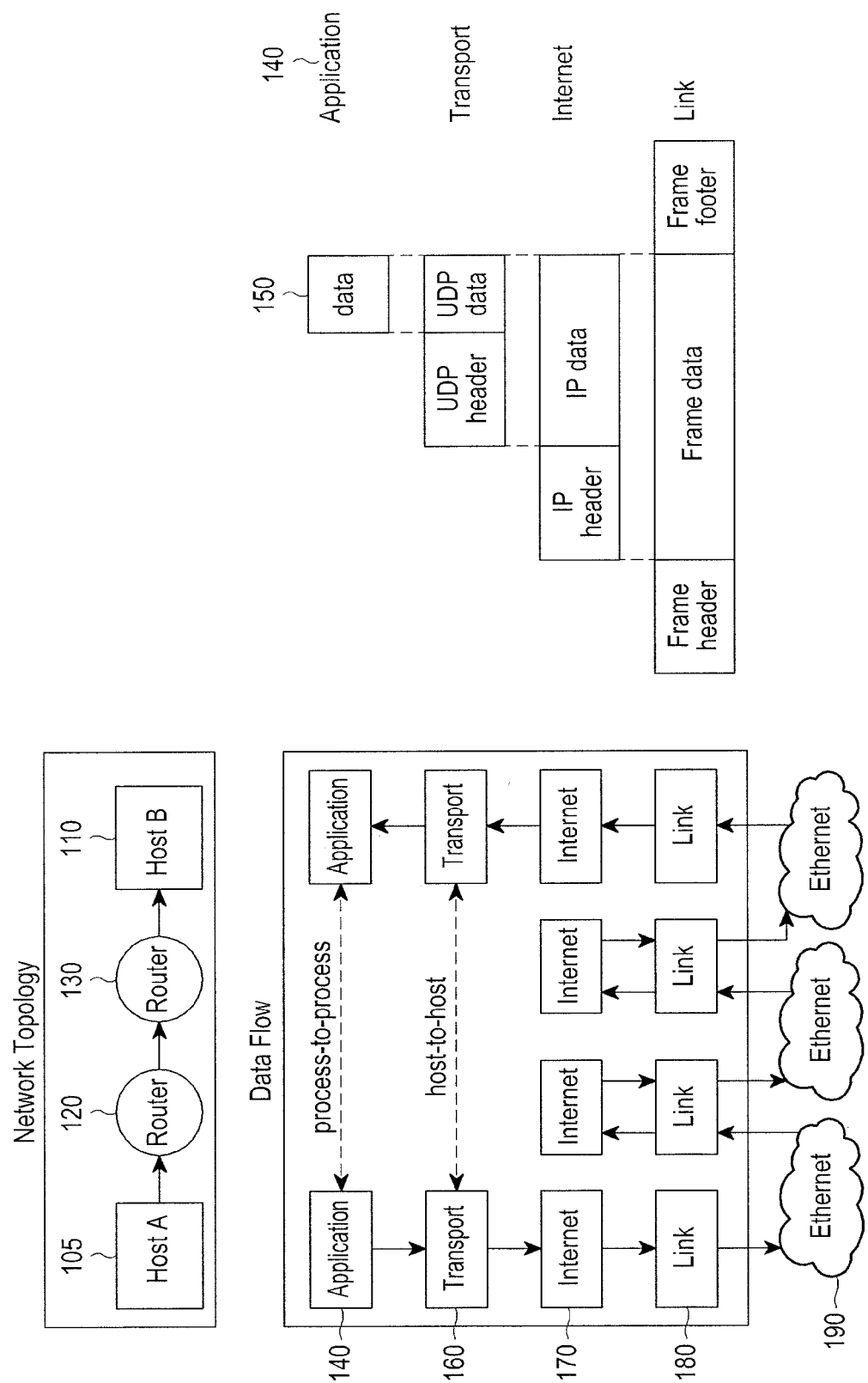
FIG. 1 is a block diagram illustrating a network topology and a data flow according to an embodiment of the present invention.

In the following description of the present invention, a detailed description of known functions and configurations incorporated herein will be omitted when it may make the subject matter of the present invention rather unclear. Then, terms described later are defined in consideration of functions of the present invention, but may vary according to the intention or convention of a user or operator. Therefore, its definition will be made based on the overall contents this specification.

Firstly, the terms used in the present invention will be described below.

FEC: an error correction symbol for correcting an error or an erasure symbol.

FEC frame: a code word generated by an FEC decoding of information to be protected, and including an information part and a parity (repair) part.

symbol: a symbol is a unit of data, and a size of a bit in bits is referred to as the symbol size.

source symbol(s): data symbol(s) to be protected which is an information part of an FEC frame.

information symbol(s): data or padding symbol(s) to be protected which is the information part of the FEC frame.

code word: an FEC frame generated by the FEC coding of the information symbol(s).

parity symbol(s): a parity symbol of the FEC frame generated by an FEC coding of the information symbol(s).

packet: a delivery unit configured of a header and a payload.

payload: a piece of user data which is to be transmitted from the sender and which is placed inside of a packet.

packet header: a header for a packet including a payload.

source payload: a payload configured of source symbols (FEC source payload is a unit of data which is protected by a Forward Error Correction (FEC) mechanism.

information payload: payload configured of information symbols (FEC information payload is a set of FEC symbols with the same index of FEC information symbol parts of the associated FEC information block or FEC information sub-block).

parity payload: a payload configured of parity symbols (FEC parity payload is a set of FEC symbols with the same index of FEC parity symbol parts of FEC parity block.)

source block: a set of payloads configured of at least one source payload (FEC source block is a segmented set of a FEC source flow and consists of pre-determined number of FEC source payloads.)

sub-block: configured of a predetermined number of FEC source payloads, and a subset of FEC source block (FEC sub-block is a subset of FEC source block and consists of pre-determined number of FEC source payloads.)

information block: a set of payloads configured of at least one of information payloads (FEC information block is a set of pre-determined number of FEC information payloads which has an equal size and is generated from FEC source block.)

parity block: a set of payloads configured of at least one parity payloads (FEC parity block is a set of FEC parity symbol parts.)

parity symbol part: parity FEC symbols generated from FEC information symbol part by FEC encoding (FEC parity symbol part is parity FEC symbols which are generated from an FEC information symbol part by FEC encoding.)

information symbol part: FEC symbol data to be considered together for FEC encoding (an information symbol part is data FEC symbols which are considered together for FEC encoding.)

information sub-block: a set of a predetermined number of information payloads having the same size and generated from the FEC sub-block (FEC information sub-block is a set of pre-determined number of information payloads which has an equal size and is generated from FEC sub-block.)

FEC block: a set of payloads configured of a set of code words, an information block, or an FEC block (FEC block consists of FEC information block or FEC information sub-block and its associated parity block.)

FEC delivery block: a set of payloads configured of a source block and parity (repair) blocks.

FEC packet: a packet for delivering an FEC block.

source packet: a packet for delivering a source block.

parity (repair) packet: a packet for delivering a parity (repair) block.

FEC packet block: a set of packets for delivering an FEC delivery block.

MMT flow: a sequence of MMT packets to deliver one or more MMT assets of one MMT package.

source flow: a sequence of source payloads identified by the same source flow identifier to deliver one or more MMT assets from one MMT server to one or more MMT clients.

parity flow: a sequence of parity payloads, which are generated by FEC encoding to protect a source flow, identified by the same parity flow identifier.

FEC flow (or FEC protected flow): configured of a source flow and one or more parity flows related to the source flow.

access unit (AU): is the smallest data entity to which timing information can be attributed.

MMT processing unit (MPU): a generic container for timed or non-timed data, independent of any specific media codec. It contains one or more AUs for timed data or a portion of data without AU boundaries for non-timed data and additional delivery and consumption related information. MPU is a coded media data unit that can be completely and independently processed. In this context processing means encapsulation into MMT Package or packetization for delivery.)

MMT asset: data entity configured of one or more M-units. The MMT asset is a logical data entity that is composed of one or more MPUs with the same MMT asset ID. The MMT asset is the largest data unit for which same composition information and transport characteristics are applied.

MMT package: a logically structured collection of data, which is composed of one or more MMT assets, MMT composition information, and MMT asset delivery characteristics.

MMT payload: a formatted unit of data to carry the MMT package or MMT signaling message either using MMT protocol or Internet application layer protocols, e.g., RTP.

MMT packet: a formatted unit of the data generated or consumed by MMT protocol.

FIG. 1 is a block diagram illustrating a network topology and a data flow according to an embodiment of the present invention.

Referring to FIG. 1, data 150 is sent and received through an application end 140, a transport end 160, an Internet end 170, a link end 180, and an Ethernet end 190 between a host A 105 and a host B 110. For example, the data 150 is made to be a UDP packet at the transport end 160 and to be an IP packet at the Internet end 170, and is sent to a frame from the link end 180.

An IP packet sent from the host A 105 is sent through routers 120 and 130 to the host B 110, but the host B 110 does not always receive the IP packet in the sequence of the IP packet sent by the host A 105. Accordingly, when the IP packet is sent, it is required to indicate a sent sequence. For this purpose, the data 150 is regarded as a real time protocol (RTP) packet data after data compressed at an AV codec end is made into a packet by using a real time protocol (RTP), or is made into a packet by a delivery protocol of the application end 140 as an MMT delivery packet data described with reference to FIG. 2 later is made into a packet.

Figure 2:
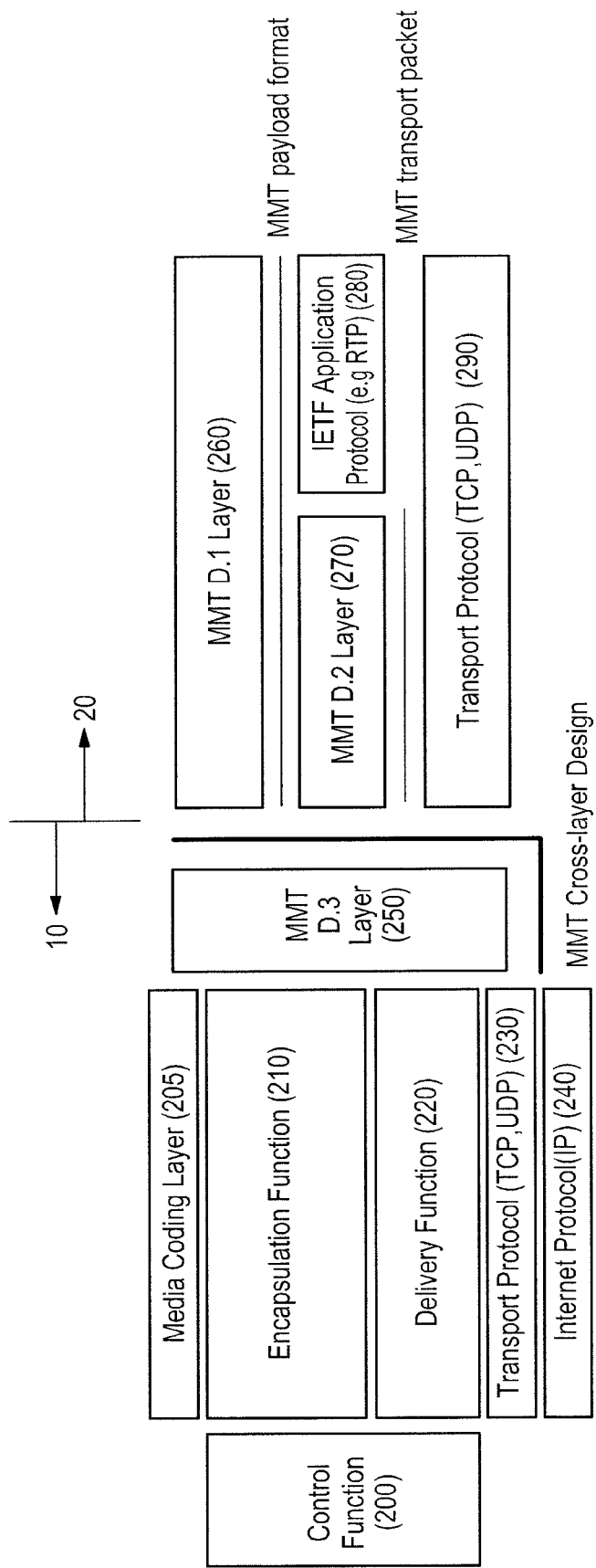
FIG. 2 is a block diagram illustrating a configuration of an MMT system according to the embodiment of the present invention.

FIG. 2 is a view illustrating a configuration of an MMT system according to the embodiment of the present invention.

In FIG. 2, a left side 10 is a view illustrating a configuration of the MMT system, and a right side 20 is a view illustrating a detailed configuration of a delivery function.

A media coding layer 205 compresses and delivers audio data and/or video data to an encapsulation function layer 210 (E. layer). The encapsulation function layer 210 makes the compressed audio/video data into a packet in the form similar to a file format, and outputs the packet to a delivery function 220.

The delivery function 220 (D. layer) makes an output of the encapsulation function layer 210 into an MMT payload format, and then adds an MMT transport packet header to the output of the encapsulation function layer 210. Next, the delivery function 220 outputs the output of the encapsulation function layer 210 to a transport protocol 230 in the form of the MMT delivery packet, or outputs the output of the encapsulation function layer 210 to the transport protocol 230 in the form of the RTP packet by using the RTP protocol. Then, the transport protocol 230 coverts the output of the encapsulation function layer 210 into one of a UDP transport protocol and a TCP transport protocol, and it delivers the converted transport protocol to the Internet protocol 240.

Finally, the Internet protocol 240 makes the output of the transport protocol 230 into an IP packet. A source payload of the present invention possibly is at least one of an MMT payload format, an MMT transport format (an MMT protocol or MMT packet), and an RTP packet.

A control function 200 (C. Layer) (or a signaling function, S. layer) manages a presentation session and a delivery session.

The delivery function 220 (D. layer) includes an MMT D.3 Layer 250, an MMT D.1 Layer 260, and an MMT D.2 layer 270. The MMT D.3 layer 250 is a cross layer interface and provides a means in one entity (sending end or receiving end) for supporting QoS through a mutual exchange of QoS related information between an application layer and underlying layers, including a MAC/PHY layer. The application layer provides information on a media characteristic which is top-down QoS information, and it provides bottom-up QoS information such as an underlying layers network channel condition. An MMT D.1 layer 260 provides an MMT payload which a generic payload formats for delivering the MMT package from the encapsulation function layer 210. It may be used as a payload format of the MMT protocol and an IETF application protocol 280, such as an RTP, and carry MMT signaling messages, such as an FEC message, according to the present invention. Further, according to the present invention, if the source payload is an MMT payload, the source payload may carry a parity packet generated by an FEC encoding. Each of assets of the MMT package includes one or more MPUs, and the MMT payload may carry one or more MPUs having an identical asset ID. Additionally, relatively large MPUs are fragmented into plural MMT payloads. The MMT D.2 layer 270 is an application layer protocol invented to efficiently and stably delivery the MMT package, and it provides the MMT protocol (MMT packet). The MMT protocol supports several features such as multiplexing, network jitter calculation, and QoS indication which are essential to delivery of various kinds of contents of coded media data. The MMT packet is generated by adding the MMT header to the MMT payload, and the MMT header includes information such as a compressed asset ID, a delivery time stamp for a network jitter calculation, and QoS indication to distinguish each multiplexed asset, according to the present invention. The MMT payload is delivered to one MMT packet, and if the source payload according to the present invention is the MMT packet, the parity packet generated by the FEC encoding is delivered to the MMT packet after the MMT header is added to the parity packet. In this event, a compressed asset ID field of the MMT header for the parity packet is delivered through an FEC message, in which a packet flow ID information value is set. The IETF application protocol 280, e.g., RTP, adds a header to the MMT payload to generate an application protocol. The transport protocol 290, e.g., TCP and UDP, receives the MMT protocol or the IETF application protocol through the payload, and adds a TCP/UDP header to the MMT protocol or the IETF application protocol to deliver the MMT protocol or the IFTF application protocol.

Figure 3:
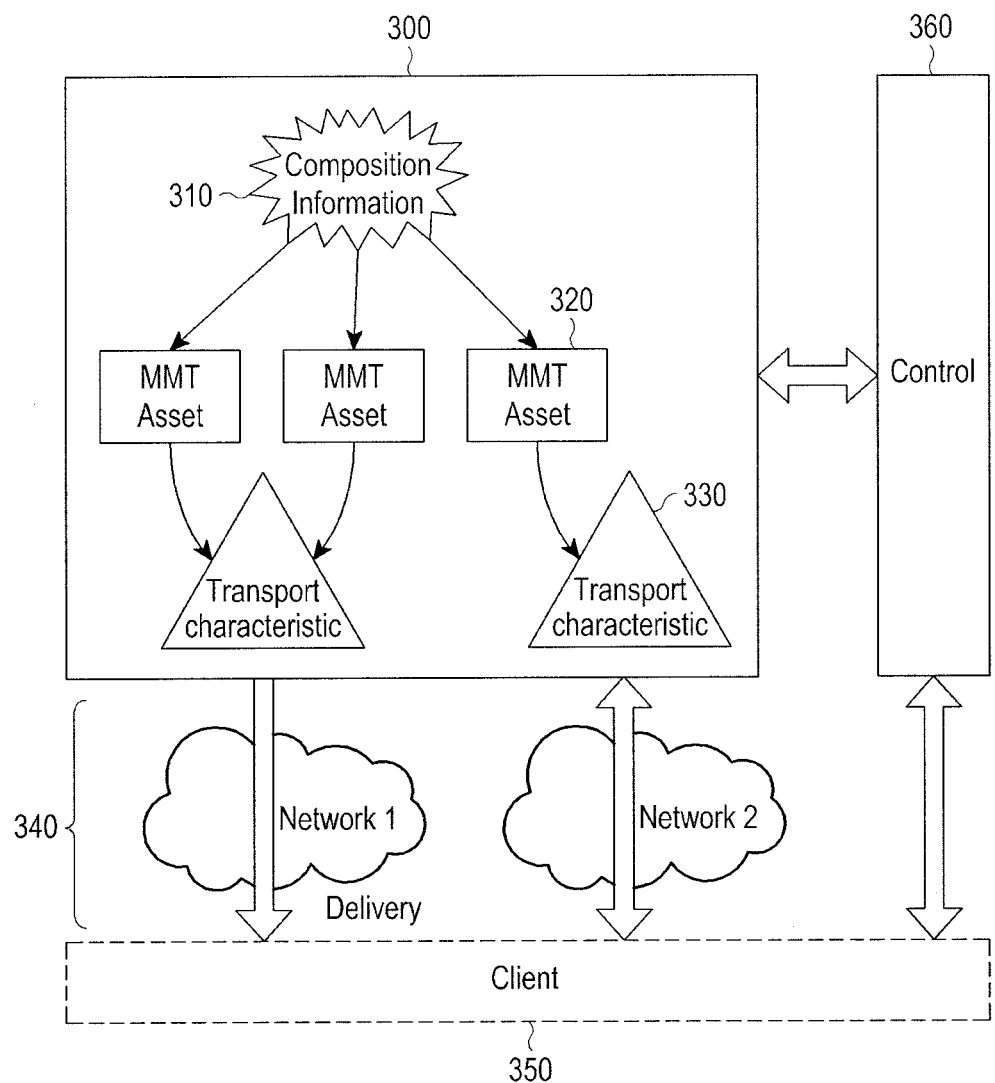
FIG. 3 is a block diagram illustrating a configuration of an MMT package according to the embodiment of the present invention.

FIG. 3 is a block diagram illustrating a configuration of an MMT package according to the embodiment of the present invention.

Referring to FIG. 3, the MMT package 300 communicates with a client 350 through a D. layer 340 of a network according to a control of a controller 360, and includes MMT assets 320, composition information 310, a transport characteristic 330.

Further, the MMT package 300 has functionality and operation for utilizing configuration information, and the configuration information includes a list, composition information, and a transport characteristic of the MMT assets 320.

Further, the MMT package 300 includes description information for describing the MMT package 300 and the MMT assets 320, composition information for helping in a consumption of the MMT assets 320, and transport characteristic information for proving a hint for a delivery of the MMT assets 320.

Further, the MMT package 300 describes a transport characteristic of each MMT asset 320, in which the transport characteristic includes error resiliency information, and simple transport characteristic information for one MMT asset 320 may be lost or may not be lost. Further, the transport characteristic may include QoS (a loss allowable extent, a delay allowable extent).

On the other hand, a detailed signaling method for an application layer forward error correction (AL-FEC) is as follows:

1. Loss Model

It is assumed that a channel model for the AL-FEC includes two loss models described below.

Generally, it is preferable to assume a random and burst erasure channel model because an erasure on the network accompanies a random erasure and a burst erasure.

Further, a REIN erasure channel specified in a DVB AL-FEC Bluebook refers to a combination with a random erasure channel. The REIN channel causes a fixed time burst erasure of Bins on a DSL line.

1.1 Random+REIN Erasure Channel Model [Ref. DVB AL-FEC Bluebook]

Repetitive Electric Impulse Noise (REIN): Fixed Time Burst Erasure (8 ms)

Two-state Gilbert-Elliot erasure channel specified in ITU G. 1050 document has a good state and a bad state, in which the good state indicates a low loss state and a bad state refers to a high loss state causing a burst erasure.

1.2 Two-State Gilbert-Elliot Erasure Channel (GEEC) Model [Ref. ITU G. 1050]

good state: random erasure channel (low loss state)
bad state: burst erasure channel (high loss state)

2. Simulation on Two Stage FEC Coding Structure

Figure 4:
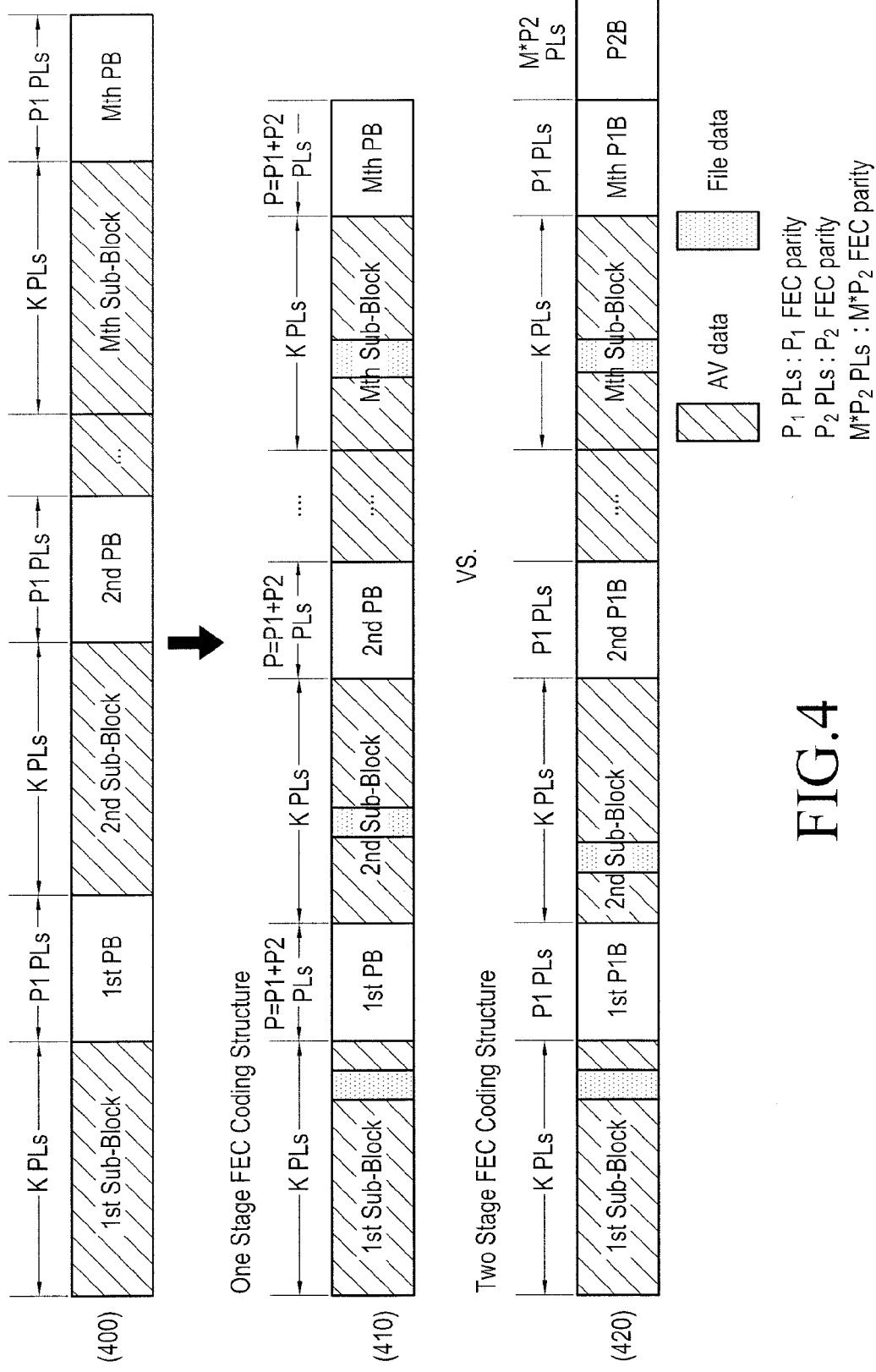
FIG. 4 is a view illustrating an FEC coding structure of one stage and two stages according to the embodiment of the present invention.

FIG. 4 is a view illustrating a one-stage or two-stage FEC coding structure according to the embodiment of the present invention.

Although it is not shown in FIG. 4, a source block for two-stage FEC coding is divided into M sub-blocks.

FIG. 4 indicates a case in which a P2 FEC parity (P2 PLs) is added to each sub-block in stage 410 for a hybrid content delivery service, e.g., AV streaming with File, and a case in which an M*P2 FEC parity (M*P2 PLs) is added to entire M sub-blocks when a required FEC performance is achieved after each sub-block of an FEC coding structure 400 adds PI FEC parity (P1 PLs) if only an AV (audio/video) data is serviced.

In the case of the hybrid content delivery service, the AV data and a file data are delivered together, and also in the case where only the AV data is serviced, an additional FEC parity is required because the file data requires more excellent FEC performance than the AV data.

Generally, since it is preferable that the AV data such as a live stream has a small delay, the AV streaming service is FEC-protected and delivered in the form of a short block in order to acquire a low delay. On the other hand, since the file data is not greatly interrupted by the delay and a partial loss of the data is not allowed, the file data requires a high FEC performance, FEC-protected and delivered in the form of a long block. The reason is because the long block has a good FEC performance rather than the short block when the long block and the short block have the same parity additional rate in an FEC characteristic.

The hybrid content delivery service such as a digital mash-up service, has been developed differently from a case where only the AV data is serviced or only the file data is serviced. The AV data and the file data are delivered together in the same stream because of the above description. In this event, since both the AV data and the file data have a different QoS, a method of effectively satisfying two different QoSes is required. That is, an FEC coding structure is required in which a low delay can be achieved for the AV data, and a higher FEC performance for the file data. Accordingly, the present invention proposes the two-stage FEC coding structure which protects the AV data by means of the short block, and protects the file data by means of the long block.

For example, even if the AV streaming and the file delivery are performed in the same stream, the file data is intermediately inserted in the AV data and delivered together with the AV data. Generally, if the FEC parity by P1 is necessary for the AV data, the file data needs the FEC parity by P=P1+P2 to meet the required performance of the file data when the AV data and the file data are simultaneously streaming since the file data requires the FEC performance higher than the AV data. Typically, in the case of having the same FEC parity rate, when the file data is recovered by using a long code, a preferred FEC performance can be obtained. Accordingly, in the case where the P2 parity is additionally allocated to the sub-block to correct the sub-block, the performance of the data will be improved as the P2 parity is added. However, in the case of the AV data, since the P1 parity satisfies the required FEC performance, it is hard to give a large meaning to the FEC performance improved by the P2 parity. Further, a more effective method is required in an environment in which a burst erasure occurs. Typically, as a method of correcting the burst erasure, very long code is used, or the burst erasure is converted into a random erasure through an interleaving, so as to improve a decoding performance. However, in the case where the burst erasure is corrected by using the interleaving or the long code, since the delay of the AV data elongates, an efficient method is required when a hybrid content transferring service, e.g., AV streaming with file, is able to be provided in an environment in which the burst erasure occurs. That is, a shorter delay is preferred for the AV data. Therefore, the AV data is configured of a short block for the shorter delay to satisfy the required FEC performance, and an FEC performance rather than the delay is further required. Accordingly, a method of maximally improving the FEC performance by configuring the AV data of a long block is required. Thus, an FEC parity of P=P1+P2 is added to each sub-block for the one stage 410 of FIG. 4, and a PI FEC parity is added to each sub-block and a P2 FEC parity is added to a source block configured of M sub-blocks for the two stages 420. The AV data is recovered by using the PI FEC parity for the sub-block, so as to achieve a shorter delay, and the file data is recovered by using the M*P2 FEC parity when the recovery of the file data using the PI FEC parity fails. As a result, a more preferable FEC performance can be achieved.

Figure 5:
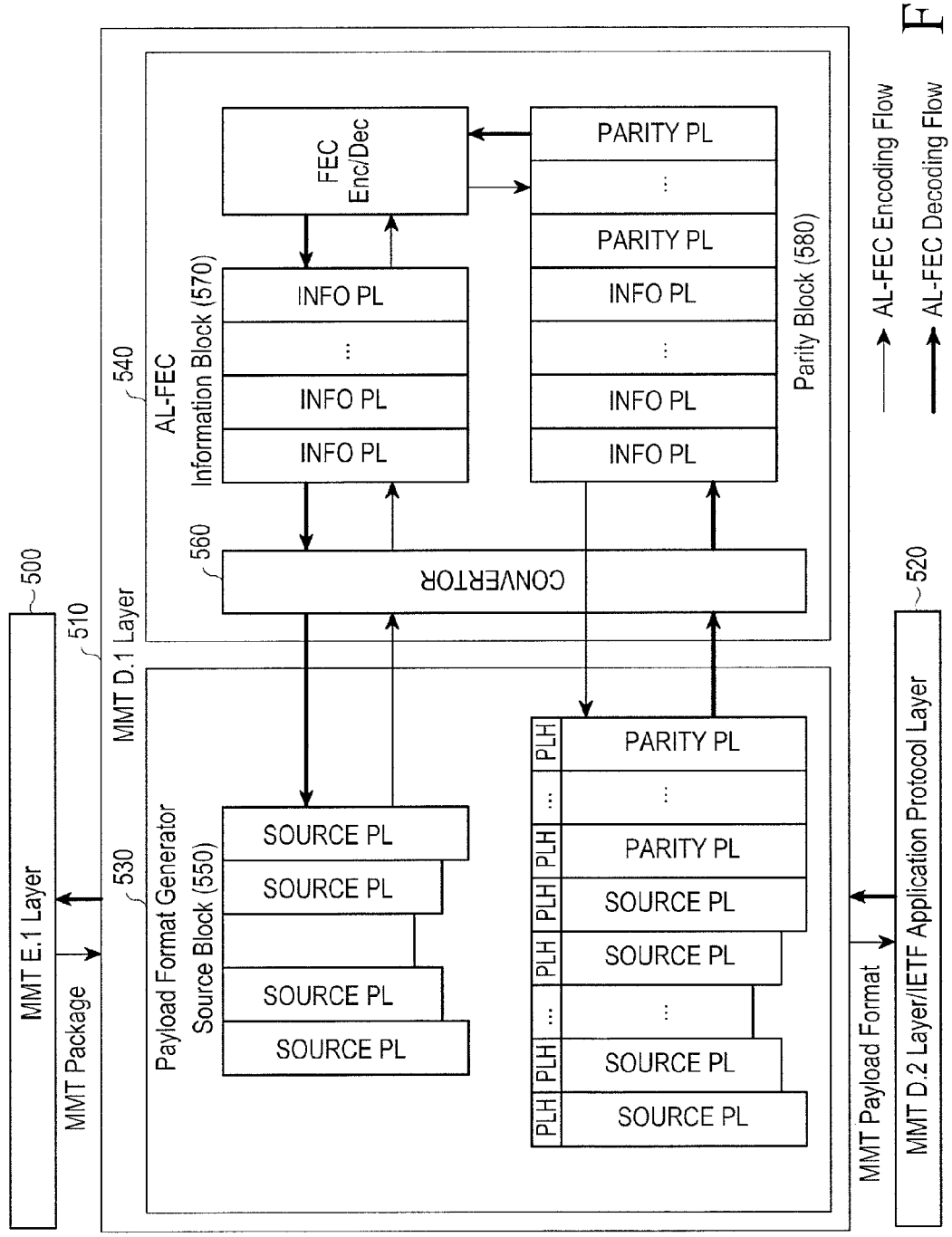
FIG. 5 is a conceptual view illustrating an encoding/decoding flow of AL-FEC according to the embodiment of the present invention.

FIG. 5 is a conceptual view illustrating an encoding/decoding flow of AL-FEC according to the embodiment of the present invention.

Referring to FIG. 5, the MMT D.1 layer 510 receives the MMT package, i.e., a format made for a purpose of storing or delivering the AV data, a file, a text, and the like, from the MMT E.1 layer 500, and it divides the MMT package into source payloads with a predetermined magnitude to configure a source block 550. An AL-FEC module convertor 560 converts a source block 550 configured of a predetermined number of source payloads into information block 570 which is a two-dimensional array configured of information payloads with an identical length. The FEC encoder performs an FEC encoding by using an FEC code provided from information block 570, so as to create a parity block 580, and it delivers the parity block 580 to a payload format generator 530. The payload format generator 530 adds the parity block 580 to the source block 550 and gives a payload header (PLH) to each payload, and then delivers the MMT payload format as a packet to the MMT D.2 layer or IETF application protocol layer 520. In this event, the payload header (PLH) includes FEC related information, which includes a start and end of the FEC packet block, a sequence of each FEC packet, a length of a source block and a parity block, and a length of an information block and a parity block in the FEC packet block, and allows the receiving end to recover a lost packet through an FEC decoding from an FEC message and the FEC related information. Further, a UDP header is added to the MMT payload format by means of a transport protocol such as a UDP, and an IP header is also added to the MMT payload format so as to deliver the MMT payload format.

For example, although the source payload is an MMT payload in FIG. 5, the source payload is not limited to the MMT payload and may be the MMT packet or the RTP packet. If the source payload is the MMT packet or the RTP packet, the payload format generator 530 of FIG. 5 corresponds to a packet format generator, and the source block becomes a predetermined MMT packet (or RTP packet). The other processes are performed identically to the above described processes to create the parity block. The parity block and the PLH are added to the source block, and then the source block is delivered to the MMT packet (or the RTP packet) to which the AL-FEC is applied. Further, an UDP header is added to the MMT payload format by means of a transport protocol such as a UDP, and an IP header is also added to the MMT payload format.

Next, a two-stage FEC coding structure in which FEC codes such as an RS code, an LDPC (or Raptor/RaptorQ) code, and the like is used will be described.

The source block configured of a predetermined number of source payloads is protected by the two-stage FEC coding structure in four manners in order to recover a loss thereof during a delivery.

Case 0: No coding structure
Case 1: FEC 1 coding structure (one stage FEC coding structure)
Case 2: FEC 2 coding structure (one stage FEC coding structure)
Case 3: FEC 1 and FEC 2 coding structure (two stage FEC coding structure)

The RS code and the LDPC (or Raptor/RaptorQ) are used for the FEC 1 code and the FEC 2 code.

The FEC 1 encoding and the FEC 2 encoding for the Case 0 are omitted. In the one stage FEC coding structure, M is set to 1. Further, the FEC 1 encoding for the Case 1 is omitted and the FEC 2 encoding for the Case 2 is omitted.

In the two-stage FEC coding structure, the source block is configured of the M sub-blocks. Each sub-block is encoded by the FEC 1 code, and the source block is encoded by the FEC 2 code.

The following Table 1 indicates an available combination of the RS and the LDPC for the two-stage FEC coding structure. In Table 1, the LDPC may be substituted with the Raptor or the RaptorQ.

TABLE 1

| FEC 1 code | FEC 2 code | Allowance |
|---|---|---|
| RS | RS | Allowed |
| RS | LDPC | Allowed |
| LDPC | LDPC | Allowed |
| LDPC | RS | Not allowed |

Therefore, the FEC coding structure which is achieved by two-stage FEC coding scheme, including one stage FEC coding structure, may have six cases as follows. (LDPC may be substituted with Raptor or RaptorQ)

No coding
RS coding (One stage)
LDPC coding (One stage)
RS—RS coding (Two stages)
RS—LDPC coding (Two stages)
LDPC—LDPC coding (Two stages)

In this case, the Case 1 is applied to the source block configured of a relatively small number of source payloads, and the Case 2 is applied to the source block configured of a relatively large number of source payloads. If the number of the source payloads for the source/sub-blocks and the number of parity payloads added by the FEC code is equal to or smaller than 255, the RS code is used. If not, the LDPC may be used. Simply, in the case where the number of source payloads for the source/serve block is classified into less than 200, 400, 800, 1600, 3200 and 6400, the source payloads less than 200 are encoded by using the RS code while the source playoads more than 400 are encoded by using the LDPC code (or Raptor/RaptorQ).

Table 1 indicates a case in which it is assumed that one code for the source block configured of a relatively small number of source payloads and one code for the source block configured of a relatively large number of source payloads are used. FEC codes may be evaluated through an error correction capability and complexity thereof. In general cases, the FEC code with a high error correction capability also has high complexity, while the FEC code with low complexity has a relatively low error correction capability. Accordingly, if the FEC code has various applicable fields, like the MMT, and a sender has a wide range of computing power, three or more FEC codes may be used. In this event, different combinations of the FEC codes for the two-stage FEC coding structure are established, as opposed to a case in which two FEC codes are used. The combinations can be acquired through a simple extension of a combination of two FEC codes.

Figure 6:
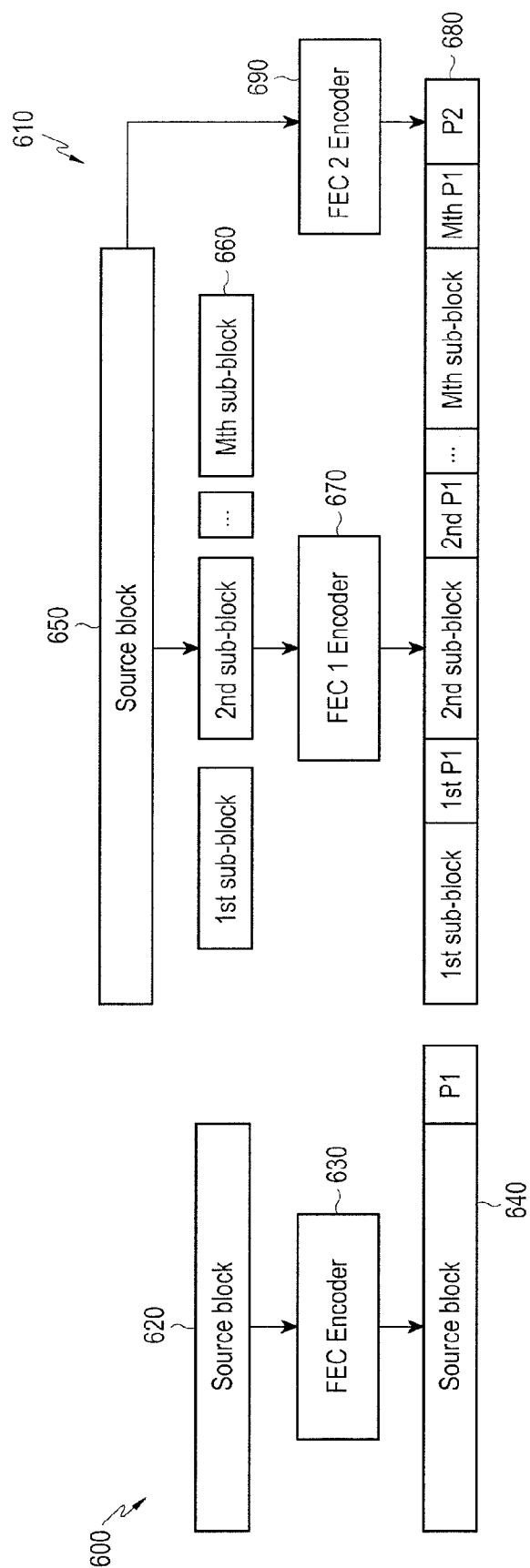
FIG. 6 is a block diagram illustrating a configuration of one stage and two stages according to the embodiment of the present invention.

FIG. 6 is a block diagram illustrating a configuration of one-stage and two-stage FEC coding according to the embodiment of the present invention.

Referring to FIG. 6, a reference numeral 600 indicates one-stage FEC coding structure, and a reference numeral 610 denotes two-stage FEC coding structure.

Firstly, the one-stage FEC coding structure 600 determines a unit of the source block 620 to be protected by the FEC encoding from one source flow, and it divides the source block 620 into a unit of a block (source block) configured of a predetermined number of source payloads. A unit to be protected may be a time of the number of source payloads. The FEC encoder 630 generates information block from each input source block through a series of processes shown in FIG. 8, generates a predetermined number of parity payloads from the information block through the FEC encoding, and finally generates the FEC transfer block of FIG. 7 configured of the source block 640 and the parity block P1. Such an FEC transfer block configures the FEC packet block through the process of FIG. 16 for an actual transfer, and the FEC packet block is delivered. For example, in the case which the source payload is the MMT packet, the PLH for FEC related signal information is added to each source payload to form the MMT packet to which the FEC is applied, and the PLH for the FEC related signal information and the MMT packet header are added to the parity payload to form the MMT packet to which the FEC is applied, so that each FEC packet is transmitted.

In the two-stage FEC coding structure 610, the source block 650 is divided into M sub-blocks, and each of plural sub-blocks 660 generates an FEC transfer block configured of the sub-block and the parity block P1 in the same manner as the one-stage FEC coding structure by using the FEC 1 encoder 670. The FEC 2 encoder 690 generates the parity block P2 from the source block like in the one-stage FEC coding structure to create the FEC delivery block.

Figure 7:
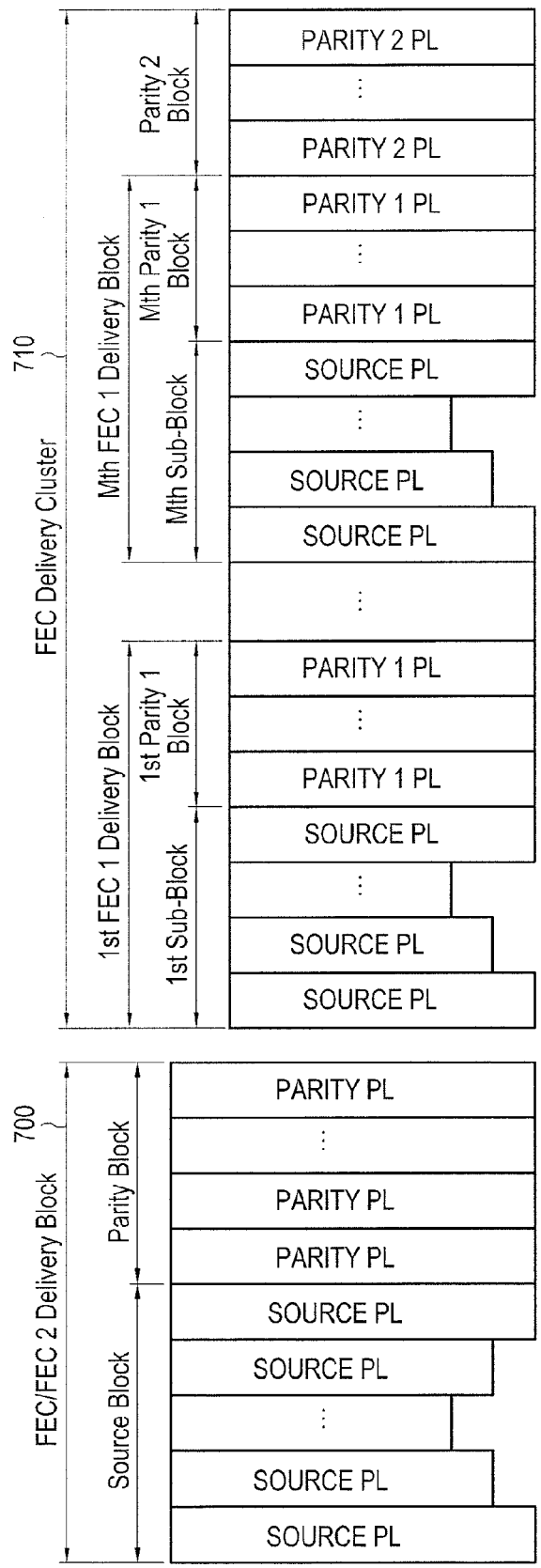
FIG. 7 is a view illustrating a configuration of an FEC delivery block and an FEC delivery cluster according to the embodiment of the present invention.

FIG. 7 is a view illustrating a configuration of an FEC delivery block 700 and an FEC delivery cluster 710 according to the embodiment of the present invention.

Referring to FIG. 7, the FEC delivery block 700 includes a source block and a parity block generated by the FEC encoder from the source block through a series of processes.

In the case where the two-stage FEC coding structure is applied to the FEC delivery cluster 710, a first FEC 1 delivery block configured of a first sub-block and a parity 1 block (first parity block) generated by the FEC 1 encoder from the first sub-block, an Mth FEC 1 delivery block configured of an Mth sub-block and a parity 1 block (Mth FEC 1 parity block) generated by the FEC 1 encoder from the Mth sub-block, and a parity 2 block generated by the FEC 2 encoder from M sub-block (=source block). The source payloads of the source block of FIG. 7 may have the same length, or different lengths. In the case where the source payloads have the same length, a padding data is added to each source payload to generate a two-dimensional array (information block) with the identical length, as shown in FIG. 8.

Figure 8:
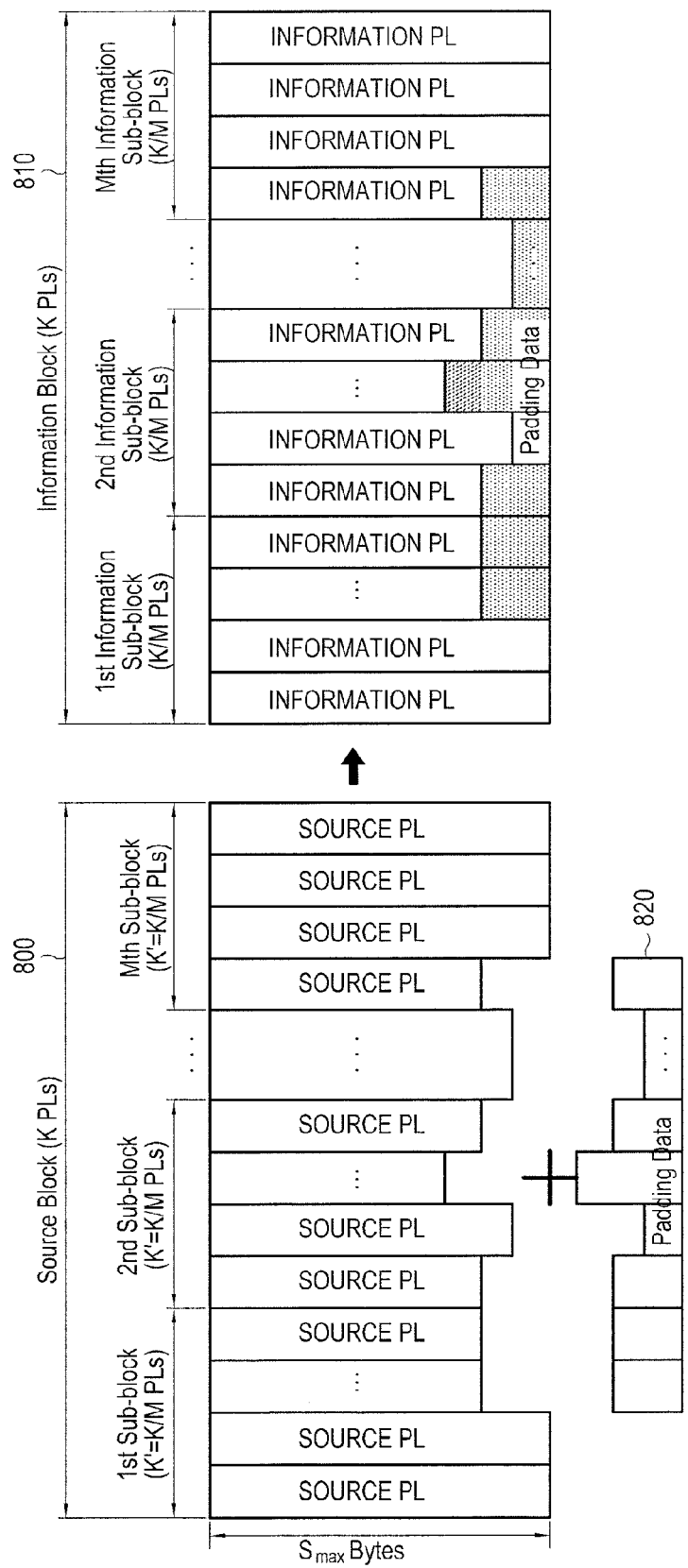
FIGS. 8 to 10 are views illustrating a process of mapping a source block to an information block according to the embodiment of the present invention.
Figure 9:
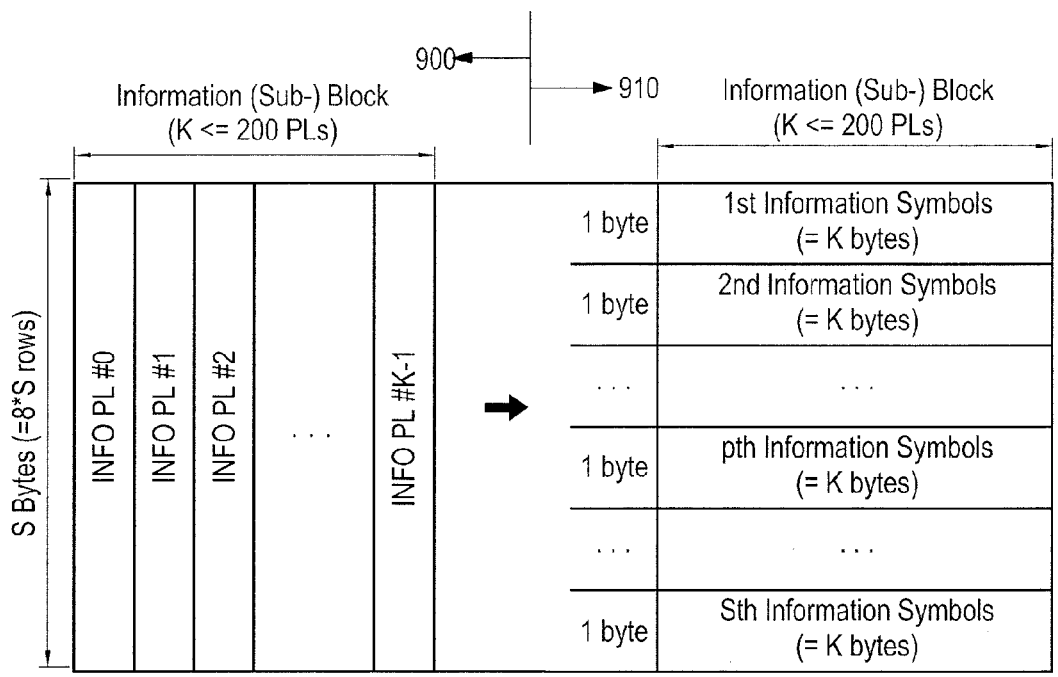
Figure 10:
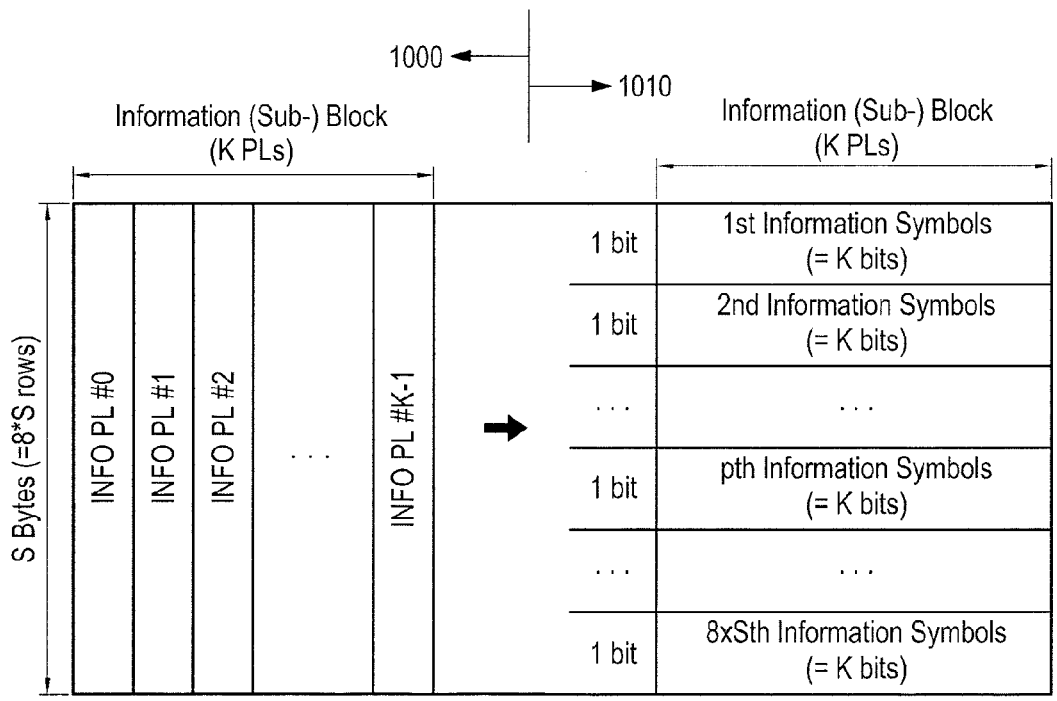

FIGS. 8 to 10 are views illustrating a process of mapping a source block on an information block 810 according to the embodiment of the present invention.

Referring to FIG. 8, the source block 800 is configured of source payloads having different lengths. Here, a maximal length of the source payload is defined as Smax Bytes, and the Smax is typically set to a smaller value because it is limited due to a magnitude of a maximum transport unit. In the drawings, the number K of the source payload in the source block is a multiple of M, and each source block is configured of the fixed number K of source payloads. However, the number of source payloads is not limited thereto and a magnitude of each source block in the source block may be configured of a different number of source payloads.

The information block 810 is configured of the information payloads having the same length, and each information payload is generated from the source payloads by adding the padding data with a predetermined value when it is necessary in order to make the length of the information payload be the Smax. That is, an ith information payload of the information block 810 is generated by adding the padding data having the predetermined value to an ith source payload of the source block 800 configured of the number K of source payloads when it is necessary in order to make the length of the information payload be Smax. (i=1, 2, . . . , K)

In the case where the information block 810 is equal to or lower than 200, information symbols for the RS coding may be generated by mapping the source block on the information block 810, as shown in FIG. 9, and information symbols for the LDPC coding may be generated, as shown in FIG. 10. In FIGS. 9 and 10, the information blocks of left side 900 and 1000 and right side 910 and 1010 are identical. That is, a value of a jth row of an ith column of the left side 900 and 1000 is identical to a jth row of an ith column of a right side 910 and 1010 (i=1, 2, . . . , K, and j=1, 2, . . . , 8*S). However, the left side 900 and 1000 is shown in a view point of the information payload, and the right side 910 and 1010 is shown in a view point of the information symbols.

In FIG. 9, a pth byte of an information payload #r is mapped on an rth byte of a pth information symbol. (r=0, 1, . . . , K−1, and p=1, 2, . . . , S)

In FIG. 10, a pth bit of an information payload #r is mapped on an rth bit of a pth information symbol. (r=0, 1, . . . , K−1, and p=1, 2, . . . , 8*S)

Figure 11:
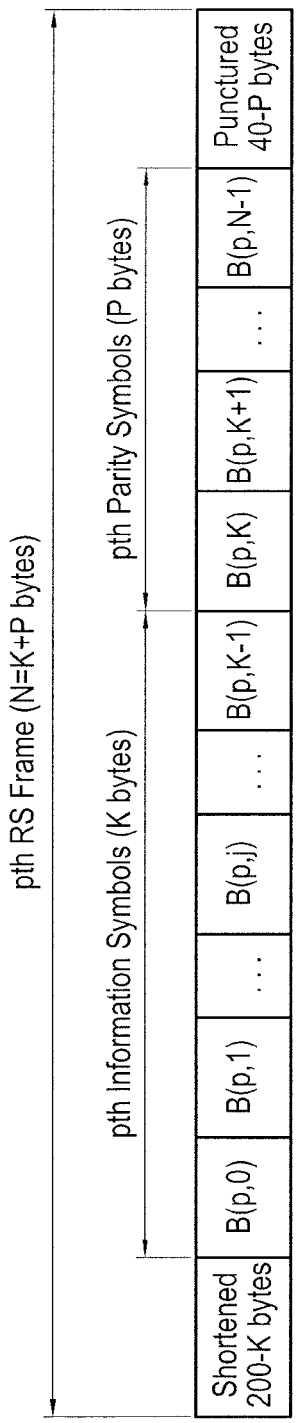
FIGS. 11 and 12 are views illustrating a process of generating a parity symbol using an information symbol according to the embodiment of the present invention.
Figure 12:
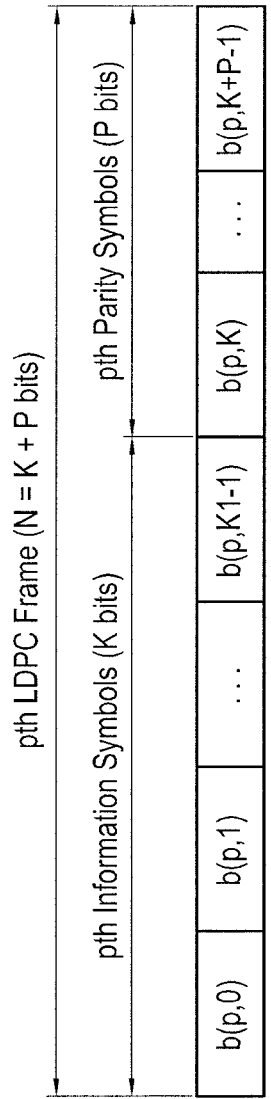

FIGS. 11 and 12 are views illustrating a process of generating a parity symbol using an information symbol according to the embodiment of the present invention.

Each of information symbols is subjected to RS encoding shown in FIG. 11 and to LDPC encoding shown in FIG. 12, so as to generate a parity symbol. Although a shortening and a puncturing are not shown in FIG. 12, the shortening and puncturing for various K and P are performed by using an LDPC code with a predetermined length so as to generate the parity symbols, like in FIG. 10. In this event, only the shortening may be performed, or only the puncturing can be performed.

In FIG. 11, a shortened 200-k byte refers to two hundred information symbols which are made for the RS encoding by adding 200-K padding bytes (all 00h) to a leading end of a pth information symbol because K is smaller than 200 in the pth information symbol configured of K bytes, and a punctured 40-P bytes means that only P bytes among forty parity bytes generated by an RS code 240 and 200 from the information symbols configured of 200 bytes are substantially delivered and a delivery of residul is intentionally omitted. By the shortening and puncturing method, it is possible to generate a parity with various lengths from various information lengths by using one RS code 240 or 200.

In the drawings, B(p, i) means an ith information byte in a pth information symbols of FIG. 9 (i=0, 1, . . . , K−1), and B(p, j) means a j-Kth parity byte in a pth parity symbol of FIG. 9 (j=K, K+1, . . . , N−1).

In FIG. 12, B(p, i) means an ith information bit in a pth information symbols of FIG. 10 (i=0, 1, . . . , K−1), and B(p, j) means a j-Kth parity bit in a pth parity symbol of FIG. 10 (j=K, K+1, . . . , N−1).

Figure 13:
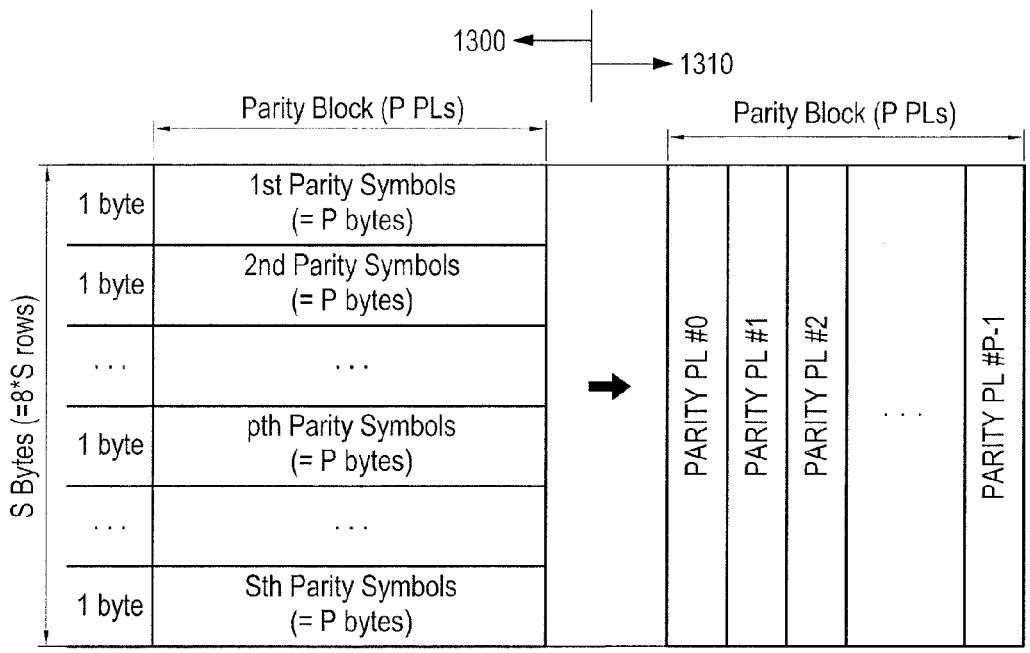

FIGS. 13 and 15 are views illustrating a process of generating a parity block by using a parity symbol according to the embodiment of the present invention.

Figure 14:
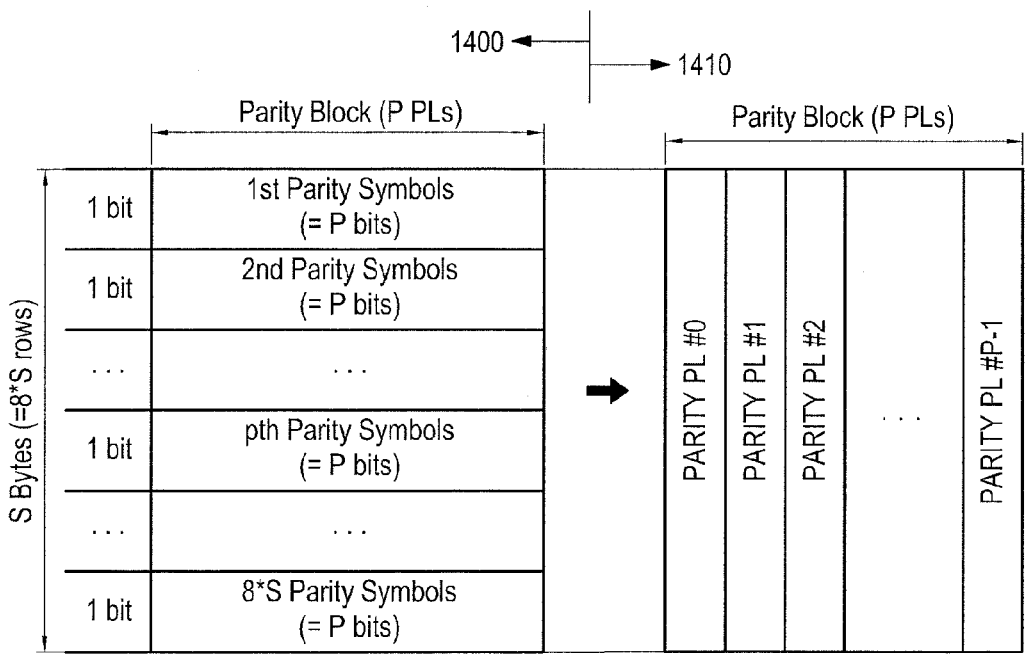

The RS parity block of FIG. 13 and the LDPC parity block of FIG. 14 are generated by using the generated parity symbols. The parity blocks on a left side 1300 or 1400 and a right side 1310 or 1410 of FIGS. 13 and 14 are identical blocks like in FIGS. 10 and 11, in which the left side 1300 or 1400 is shown in a view point of the parity symbol, and the right side 1310 or 1410 is shown in a view point of the parity payload.

On the other hand, a specification of the RS code and the LDPC code will be described below.

Primitive polynomial of RS (N, K) code over the finite field $GF(2^8)$ $$p(x)=x^8+x^4+x^3+x^2+1$$

Symbols of $GF(2^8)$ may be illustrated as $\alpha^7, \alpha^6, \alpha^5, \alpha^4, \alpha^3, \alpha^2, \alpha, 1$.

Here, $\alpha=00000010$ (binary)

When each RS codeword (rsc) is expressed by a vector, it is indicated that rsc=(e0, e1, ..., e199, p200, p239). The information has a magnitude of 200 bytes, and the RS code over the finite field GF ($2^8$) of which the parity is 40 bytes.

An LDPC (K+P, K) code over the finite field GF(2) has a QC-LDPC structure configured of K information bites and P parity bits. Here, K=L×80, L=1, 2, 4, 8, or 16.

Especially, the parity part of the LDPC has a form of approximately triangular matrix shown in FIG. 15. FIG. 15 shows a configuration of H matrix. In FIG. 15, K=400, and P=L×80 (L=1, 2, 4, 8, or 16).

In FIG. 13, an rth byte of pth parity symbols is mapped on a pth byte of an rth parity payload (p=1, 2, ..., S, and r=0, 1, ..., P−1), and in FIG. 14, an rth bit of the pth parity symbols is mapped on a pth bit of an rth parity payload (p=1, 2, ..., 8*S, and r=0, 1, ..., P−1).

Figure 16:
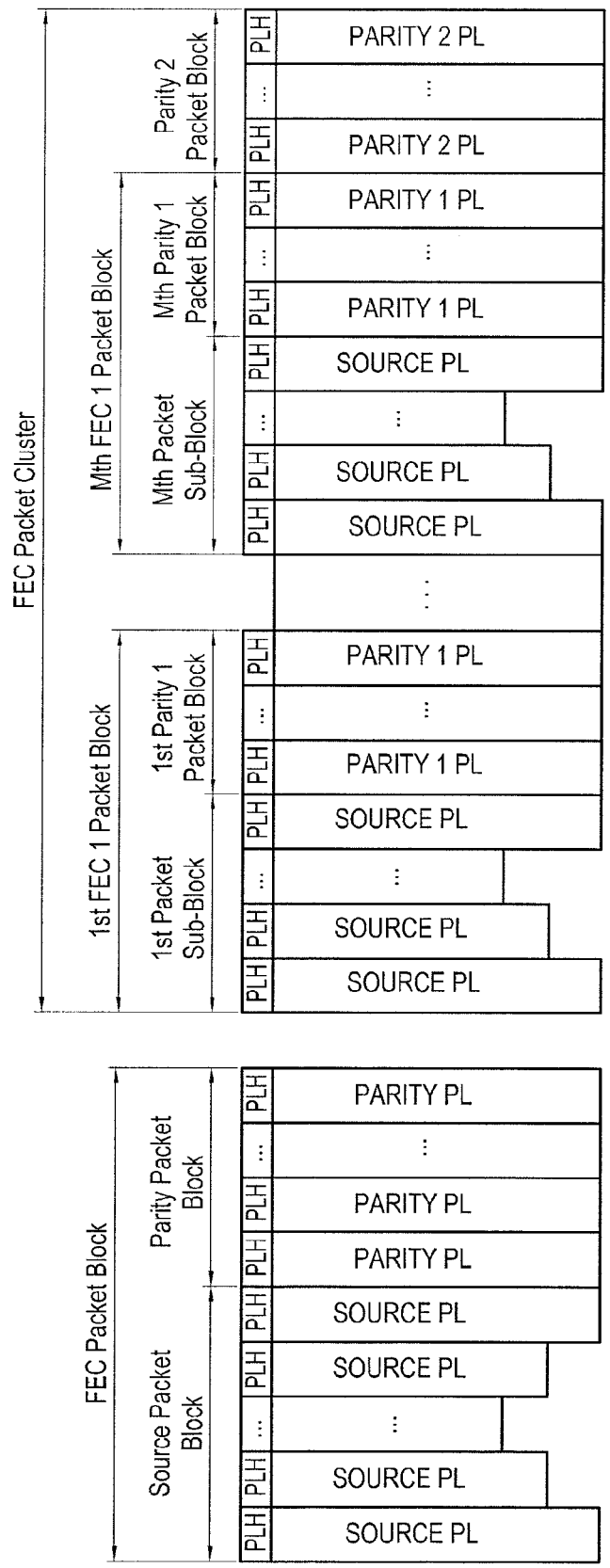
FIG. 16 is a view illustrating an FEC packet block according to the embodiment of the present invention.

FIG. 16 is a view illustrating an FEC packet block according to the embodiment of the present invention.

Referring to FIG. 16, the FEC packet block is configured of a source block and a parity block, and the FEC packet cluster is configured of a sub-block and a parity block. The FEC packet block configured of the source block and the parity block or the FEC cluster configured of the sub-block and the parity block has an FEC packet header (PLH) given to a leading end of each payload, and is delivered to the FEC packet block or the FEC packet cluster, which is configured of the FEC packet. In FIG. 16, although the FEC packet header (PLH) is added to the leading end of the payload, a location of the FEC packet header is not limited to the leading end of the payload, and the FEC packet header may be added to a rear end of the payload.

The FEC packet header storing and delivering FEC configuration information is preferably interpreted as a field storing the FEC related information in the FEC packet, and may include the FEC related information. That is, the FEC packet header includes a beginning point and an end point of the FEC packet block, a sequence of each FEC, a length of the source block and the parity block (or a length of information block and parity block), and the like in the FEC packet block. The receiving end may recover a lost packet through the FEC decoding by using the FEC message and the FEC related information. Further, the FEC packet header may store information through which the receiving end can identify an FEC flow ID, a source flow ID, a parity flow ID to which the FEC packet belongs, or information on compressed asset ID. In this event, if the compressed asset ID information is stored in a D layer header such as the MMT header or the MMT payload header instead of the FEC packet header, the D layer header may be used.

The FEC packet header indicates what is a coding structure applied to the AL-FEC by the sender. That is, the FEC packet header format includes a fec_coding_structure field, which is defined as follows.

fec_coding_structure: a FEC coding structure used to protect a corresponding source flow. (This field shall indicate the applied AL-FEC coding structure for its associated Source Flow.)

According to the embodiment of the present invention, in the case where a structured multiple FEC coding scheme including the two-stage coding structure and a layer-aware FEC (LA-FEC) is applied to the FEC packet header, the fec_coding_structure may be defined as follows.

b000: No coding structure (Case 0)
b001: One stage FEC coding structure (Case 1)
b010: One stage FEC coding structure (Case 2)
b011: Two stage FEC coding structure (Case 3)
b100: LA-FEC coding structure
b101~b111: reserved The above b001 (Case 1) means use of an FEC code suitable for protecting a source block configured of a relatively small number of source payloads, and the b010 means use of an FEC code suitable for protecting a source block configured of a relatively large number of source payloads.

Further, the b011 (Case 3) indicates a case in which the two-stage FEC coding structure is applied to the FEC packet header.

The b100 indicates a case in which the layer aware FEC (LA-FEC) coding structure is applied to the FEC packet header. The LA-FEC means that the source block is divided into a sub-block for a base layer and a sub-block for an enhanced layer and generates a parity 1 block through the FEC 1 encoder, and the sub-block generates a parity 2 block through the FEC 2 encoder.

According to another embodiment of the present invention, the fec_coding_structure may be defined as follows if an FEC code of combinations indicated in Table 1 is used.

<First>
b000: No coding structure
b001: RS coding structure
b001: LDPC coding structure
b011: RS-RS two-stage coding structure
b100: RS-LDPC two-stage coding structure
b011: LDPC-LDPC two-stage coding structure
Others: reserved <Second>
b000: No coding structure
b001: RS coding structure
b010: LDPC coding structure
b101: RS-RS two-stage coding structure
b110: LDPC-LDPC two-stage coding structure
bill: RS-LDPC two-stage coding structure
Others: reserved In the second case, if b2=1, it indicates that the two-stage coding structure is applied to the FEC packet header; if b1=1, it indicates that an LDPC code is applied to the FEC packet header, and if b0=1, it indicates that an RS code is applied to the FEC packet header. In the above description, the LDPC may be substituted with the raptor or the raptorQ.

A signal for the fec_coding_structure may be stored in the FEC packet header and delivered as an in-band signal. The signal may be stored in an FEC control packet like an FEC message or in a header or a payload of an RTP control packet like an RTCP and delivered to the receiver so that the receiver can recognize the signal.

On the other hand, the present invention provides an FEC flow structure for delivering MMT flows, i.e., an FEC flow, protected by the AL-FEC scheme based on a QoS (a loss property, a delay property, and the like) of each MMT asset, and a method of managing an application layer forward error correction (AL-FEC) when the sender delivers one or more MMT assets to a receiver through the MMT flow. For this purpose, the sender of the present invention delivers one or more FEC flows configured of the AL-FEC protected packet of the MMT assets in the MMT packet and a sequence of the MMT packets configured of parities of the assets through the D. Layer. The D. Layer provides a mechanism for protecting the MMT flow based on QoS of the MMT asset included in the MMT flow in the MMT package, and a C. Layer enables the sender and the receiver to deliver and receive description information for the FEC flows so that the receiver identifies in advance the description information (FEC flow description=FEC message) for the FEC flows through the received MMT packets.

An example, in which the FEC related message according to the present invention is delivered through the C. Layer, may be configured of following Tables and related information.

C. An FEC related control message of Layer is configured as indicated in Table 2.

TABLE 2

```
...
fec_flag
if (fec_flag==1){
    length_of_fec_flow_description( )
        fec_flow_description( )
}
```

In Table 2, each field means as follows:

fec_flag: indicates whether an FEC is applied to a delivery of a source flow when one MMT server delivers one or more source flows to one or more MMT clients.

length_of_fecflow_descriptor( ): indicates a magnitude (byte) of an FEC flow descriptor including the field. This value is set when at least one source flow is protectively delivered by the FEC.

An embodiment of the fec_flag is as follows:

b0: all source flows are delivered without a protection by the FEC code. (Every source flow is delivered without AL-FEC protection.)

b1: at least one source flow is delivered with the AL-FEC protection. (At least one source flow is delivered with AL-FEC protection.)

Further, the FEC flow descriptor includes QoS (a loss property, a delay property, and the like) for the MMT asset included in each FEC flow, and information on an FEC coding structure applied to the MMT asset and an FEC coding algorithm.

The FEC flow descriptor is configured as indicated in Table 3.

TABLE 3

```
fec_flow_descriptor( ){
    protection_mode
    number_of_fec_flows: N1
    for (i=0;i<N1;i++) {
        number_of_assets_for_fec_flow_I;N2
        for(j=0;j<N2;j++) {
            asset_id
            compressed_asset_id
            error_resiliency
            delay_correlation_indicator
        }
        fec_coding_structure_for_fec_flow_i: FCS_i
        parity_flow_descriptor(FCS_i)
    }
}
```

In Table 3, each field means as follows:

protection_mode: indicates a range of a source payload protected by the FEC. For example, if the source payload is an MMT payload format generated in the D.1 Layer, or an MMT transport packet to which a D.2 header is added, a value and a meaning of a protection_mode field are as follows:

0: applying FEC to the MMT payload by using the MMT payload format as the source payload.

1: applying FEC to the MMT transport packet by using the MMT payload format as the source payload.

number_of_fec_flows: indicates the number of FEC flows number_of_assets_for_fec_flow_i: indicates the number of MMT assets applied by each FEC flow i (i=0, 1, 2, . . . , N1−1)

asset_id: indicates MMT asset ID compressed_asset_id: compressed MMT asset ID error_resiliency: indicate error resiliency according to a field value as follows:

0: lossless

1: lossy delay_correlation_indicator: indicates a correlation between another asset and a delay. If a corresponding asset has to be synchronized with another asset, the error resiliency is set to 1, and if not, the error resiliency is set to 0. For example, if the corresponding asset which is a video asset has to be synchronized with an audio asset, a field value of the video asset and a field value of the audio asset are set to 1 to indicate necessity for the synchronization, or if a synchronization of the corresponding asset which is a file asset and another asset is unnecessary, a filed value of the corresponding asset is set to 0. If a plurality of MMT assets is protected in the FEC flow by two-stage FEC coding and delivered, a field value for each MMT asset is set to be adjustable to a condition, and the receiving end may determine whether the FEC 2 decoding is performed for each asset. For example, if the audio asset, the video asset, and the file asset are coded by the two-stage FEC coding in one FEC flow, the field value for the audio asset and the video asset is set to 1, and the field value for the file asset is set to 0, it means an identical delay of the audio asset and the video asset such that the audio asset and the video asset are output together after the FEC 1 coding or the FEC 2 coding. In the case of the file asset, the file asset need not to be output together to have the identical delay to the audio asset and the video asset. Therefore, if the FEC 1 decoding fails, the FEC 2 decoding is preferably performed to recovery the file asset.

That is, it is preferred that the audio asset and the video asset are not output through different delays such that the audio asset is output after the FEC 1 decoding and the video asset is output after the FEC 2 decoding.

fec_coding_structure_for_fec_flow_i: indicates an FEC coding structure applied to an FEC flow i (i=0, 1, 2, . . . , N1−1) according to a field value.

b000: No coding structure (Case 0)

b001: One-stage FEC coding structure (Case 1)

b010: One-stage FEC coding structure (Case 2)

b011: Two-stage FEC coding structure (Case 3)

b100: LA-FEC coding structure b101~b111: reserved parity_flow_descriptor(FCS_i: includes a method of creating an information language block used to generate an identifier of a parity flow and a parity payload which belongs to a parity flow, control information according to the method, information on an FEC code, and information for a buffer size, which is prepared by the receiver, in order to decode the FEC code. An exemplary embodiment of the parity_flow_descriptor (FCS_i) will be described below.

Although an FEC flow label value is not indicated in Table 3, the FEC flow label value for each FEC flow may be provided to distinguish each FEC flow. Further, since such FEC flow label information is delivered in the form of being stored in the D. Layer of each packets delivered by one FEC flow, the receiver can easily distinguish the FEC flow from the FEC flow label information.

The D. Layer header includes an asset ID field which is information for identifying each media component in the MMT payload, and the asset ID field of the D. Layer header is configured as indicated in Table 4.

TABLE 4

Asset ID Information Field 0 {
    Number_of_media_components: N3
    For (k=0; k<N3; k++) {
        compressed_asset_id_of_media_component_k
        length_of_media_component_k
    }
}

In Table 4, each field means as follows:
number_of_media_components: indicates the number of media components in a related MMT payload.
compressed_asset_id_of_media_component_k: a compressed asset ID of the related MMT asset having the media component k (k=0, 1, 2, . . . , N3−1).
length_of_media_component_k: indicates a magnitude (byte) of the media component k (k=0, 1, 2, . . . , N3−1).

The media component in Table 4 means data of asset delivered to the payload.

Another embodiment for delivering an FEC related message through C. Layer according to the present invention is configured of information and following Tables.

The MMT flow related message of C. Layer is configured as indicated in Table 5.

TABLE 5

...
mmt_flow_descriptor( ) {
    package_id
    number_of_mmt_flows: N1
    for (i=0; i<N1;i++) {
        mmt_flow_id
    number_of_assets: N2
        For(j=0; j<N2; j++) {
            asset_id
            short_asset_id
            error_resiliency
            delay_correlation_indicator
        }
    }
}

In Table 5, each field means as follows:
packaged_id: indicates ID of the MMT package.
number_of_mmt_flows: indicates the number of MMT flows.
mmt_flow_id: MMT flow identifier
number_of_assets: indicates the number of MMT assets delivered to a corresponding MMT flow
asset_id: identifier of the MMT asset
short_asset_id: a short asset ID used in D.Layer header (in the case bits of a field indicating an asset ID is too much, when the bits of the field are indicated as a compressed value and stored in the D. Layer, an overhead can be reduced by reducing the bits of the field for indicating the asset ID.)

error_resiliency: indicate error resiliency according to a field value as follows:
0: lossless
1: lossy
delay_correlation_indicator: indicates a correlation between another asset and a delay. If a corresponding asset has to be synchronized with another asset, the error resiliency is set to 1, and if not, the error resiliency is set to 0. For example, if the corresponding asset which is a video asset has to be synchronized with an audio asset, a field value of the video asset and a field value of the audio asset are set to 1 to indicate necessity for the synchronization, or if a synchronization of the corresponding asset which is a file asset and another asset is unnecessary, a filed value of the corresponding asset is set to 0.

If a plurality of MMT assets is protected in one FEC flow by two-stage FEC coding and delivered, a field value for each MMT asset is set to be adjustable to a condition, and the receiving end may determine whether the FEC 2 decoding is performed for each asset. For example, if the audio asset, the video asset, and the file asset are coded by the two-stage FEC coding in one FEC flow, the field values for the audio asset and the video asset are set to 1, and the field value for the file asset is set to 0, it means an identical delay of the audio asset and the video asset such that the audio asset and the video asset are output together after the FEC 1 coding or the FEC 2 coding. In the case of the file asset, the file asset need not to be output together to have the identical delay to the audio asset and the video asset. Therefore, if the FEC 1 decoding fails, the FEC 2 decoding is preferably performed to recover the file asset maximally.

That is, it is preferred that the audio asset and the video asset are not output through different delays such that the audio asset is output after the FEC 1 decoding and the video asset is output after the FEC 2 decoding. The FEC flow descriptor is configured as indicated in Table 6.

TABLE 6

...
fec_flow_descriptor 0 {
    number_of_fec_flows: N3
    for (i=0; i<N3; i++) {
        fec_flow_id
        fec_coding_structure_for_fec_flow_i: FCS_i
        parity_flow_descriptor (FCS_i)
        number_of_mmt_flows: N4
            mmt_flow_id_list
    }
}

In Table 6, each field means as follows:
number_of_fec_flows: indicates the number of FEC flows
fec_flow_id: an FEC flow identifier for distinguishing FEC flow i (i=0, 1, 2, . . . , N3−1)
fec_coding_structure_for_fec_flow_i: indicates an FEC coding applied to an FEC flow i (i=0, 1, 2, . . . , N3−1) according to a field value.
b000: No coding structure (Case 0)
b001: One-stage FEC coding structure (Case 1)
b010: One-stage FEC coding structure (Case 2)
b011: Two-stage FEC coding structure (Case 3)
b100: LA-FEC coding structure
b101~b111: reserved
Parity_flow_descriptor(FCS_i): includes a method of generating an identifier of a parity flow and an information language block in order to generate a parity payload which belongs to the parity flow, control information according to the method, information on the FEC code, and information on a buffer size prepared by the receiver in order to decode the FEC code. An exemplary embodiment of the parity_flow_descriptor(FCS_i) will be described later.

number_of_mmt_flows: indicates the number of MMT flows protected by the FEC flow i (i=0, 1, 2, . . . , N3−1)

mmt_flow_id_list: a list of MMT flow identifiers protected by the FEC flow i (i=0, 1, 2, . . . , N3−1)

It is possible to identify the number of MMT assets delivered to the MMT flow, an MMT asset identifier, and a short asset ID, which are indicated by each MMT flow identifier described in the MMT flow descriptor, from the list of the MMT flow identifiers. That is, it may be identified whether MMT assets in a corresponding FEC flow are protected and delivered. It is possible to identify the short asset ID stored in the D. Layer Header for each MMT asset identifier.

The D. Layer header includes an asset ID field which is information for identifying each media component in the MMT payload, and the asset ID field of the D. Layer header is configured as indicated in Table 7.

TABLE 7

...
fec_flow_id
fec_coding_structure
sequence_number
Aggregation Information Field   number_of_media_components:N5
For (i=0; i<N5; i++) {
short_asset_id
offset_of_media_components
length_of_media_components In Table 7, each field means as follows:

fec_flow_id: FEC flow identifier fec_coding_structure: indicates an FEC coding applied to each FEC block delivered to a corresponding FEC flow ID. Although the corresponding FEC flow ID indicates a two-stage FEC coding in the C. Layer, the fec_coding_structure is to indicate the FEC coding applied to each FEC block for a case where the FEC coding structure applied to each FEC block need not be restricted only by the two-stages. That is, an expression that the corresponding FEC flow ID indicates the two-stage FEC coding in the C. Layer message is interpreted as a meaning that the corresponding FEC flow includes the FEC block having the two-stage FEC coding.

sequence number: sequentially increases in one FEC flow ID for the purpose of distinguishing a sequence of the D. Layer packets of each FEC flow ID.

number_of_media_components: indicates the number of media components in a related MMT payload.

short_asset_id_of_media_component: indicates a short asset ID of a related MMT asset having a media component k (k=0, 1, 2, . . . , N5−1). The receiving end may determine an MMT asset which a short asset ID received from the C. Layer indicates, through the FEC descriptor( ) information.

offset_of_media_component: indicates an initial position in the D. Layer payload including a media component k (k=0, 1, 2, . . . , N5−1.) When the offset_of_media_component is zero (0), a corresponding component is initialized from a first byte of the payload. Especially, it is useful if each media component is not continuously arranged.

length_of_media_component: indicates a magnitude (byte) of the media component k (k=0, 1, 2, . . . , N5−1).

In Table 7, the media component means data of an asset delivered to the payload, and it is assumed that different assets are multiplexed to one payload. In the case that only data from one asset is delivered by using one payload, the short asset ID indicates an ID of the asset to which the delivering payload belongs. In this event, the short asset ID is stored in the MMT packet header or the MMT payload header.

According to another embodiment of the present invention, the source flow ID and the parity flow ID may be directly acquired from the header of the source packet and the header of the parity packet, respectively, or may be extracted by combining information included in the header and the flow related information of the C. Layer. The FEC flow descriptor is indicated in Table 8.

TABLE 8 fec_flow descriptor ( ) {
    protection_mode
    number_of_fec_flows: N1
    for (i=0; i<N1; i++) {
        fec_flow_id_for_fec_flow_i
        Source_flow_id_for_fec_flow_i
        fec_coding_structure_for_fec_flow_i: FCS_i
        parity_flow_descriptor (FCS_i)
    }
}

In Table 8, each field means as follows:

protection_mode: indicates a range of a source payload protected by the FEC. For example, in the case where the source payload is an MMT payload format itself generated in D.1 Layer, or a value and a meaning of the protection_mode field are as follows:

0: applying FEC to the MMT payload by using the MMT payload format as the source payload.

1: applying FEC to the MMT delivery packet by using the MMT delivery packet as the source payload.

number_of_fec_flows: indicates the number of FEC flows fec_flow_id_for_fec_flow_i: indicates an identifier for distinguishing each FEC flow i (i=0, 1, 2, . . . , N1−1).

fec_flow_id_for_fec_flow_i: indicates an identifier for distinguishing a source flow protected by each FEC flow i (i=0, 1, 2, . . . , N1−1).

fec_coding_structure_for_fec_flow_i: indicates an FEC coding structure applied to the FEC flow i (i=0, 1, 2, . . . , N1−1).

b000: No coding structure (Case 0)
b001: One-stage FEC coding structure (Case 1)
b010: One-stage FEC coding structure (Case 2)
b011: Two-stage FEC coding structure (Case 3)
b100: LA-FEC coding structure
b101~b111: reserved parity_flow_descriptor(FCS_i): includes a method of generating an identifier of a parity flow and an information language block in order to generate a parity payload which belongs to the parity flow, information for a control according to the method, information on the FEC code, and information on a buffer size prepared by the receiver in order to decode the FEC code. An exemplary embodiment of the parity_flow_descriptor (FCS_i) will be described later.

The FEC flow descriptor different from that indicated in Table 8 is denoted in Table 9.

TABLE 9

```
fec_flow_descriptor ( ) {
    protection_mode
    number_of_fec_flows: N1
    for (i=0; i<N1; i++) {
            fec_flow_id_for_fec_flow_i
            source_flow_id_for_fec_flow_i
Number_of_assets: N2
        for (j=0; j<N2; j++) {
            asset_id
            short_asset_id
            error_resiliency
            delay_correlation_indicator
        }
        fec_coding_structure_for_fec_flow_i: FCS_i
        parity_flow_descriptor(FCS_i)
    }
}
```

A meaning of each field in Table 9 is identical to those of Tables 5 and 8.

On the other hand, according to the present invention, an AL-FEC scheme which supports one-stage and two-stage FEC coding structure, a Layer-aware FEC coding structure, and three types of ibg_mode may be considered. A pretreatment process is required in which a source block configured of the source payloads which are an input from a superordinate layer is converted into information blocks configured of information payloads adjustable to the FEC coding. Here, the pretreatment process uses various algorithms according to a property of the source payloads and a processing capability of a decoder. The algorithms are referred to as ibg_mode. An embodiment of ibg_mode is described later.

An embodiment of ibg_mode0 which is used when all the source payloads have an identical length is described below. In the ibg_mode0, the source payloads configuring the source block have the identical length, and the information block is identical to the source block. Accordingly, the number of the source payloads configuring the source block is identical to the number of the information payloads configuring the information block.

If the source payloads have different lengths, the embodiment of ibg_mode1 is as follows. In the ibg_mode1, each source payload corresponds to one information payload. The information payload includes information on the length of the source payload, the source payload, and the padding data. The padding data is a value for setting the length of the information payload identical to the Smax, in which 00h is typically allocated to each byte. The Smax is given by a unit of a maximal delivery of a system, or is given as a maximum value of the length of the source payloads included in the source block.

If the source payloads have different lengths, the embodiment of ibg_mode2 is as follows. In the ibg_mode2, each information payload is configured of N information sub-payloads, and includes the padding data so that an initial point of the source payload is identical to an initial point of the information sub-payload when information on each source payload and the length of each source payload is located in the information block. The following values are defined for use in the description of an exemplary method of configuring the ibg_mode2.

KSP: the number of source payloads configuring the source block.

KIP: the number of source payloads configuring the source block.

Ri: octets of ith source payload to be added to the information block.

Li: length of an octet unit of Ri.

Li: two octets written in a network byte order indicating a value of li.

T: length of a byte unit of the information payload.

N: number of the information sub-payload configuring one information payload.

T: length of a byte unit of the information payload (T'=T/N)

Sj: minimal integer satisfying a formula, siT/N=siT'≥(li+2)

Pi: octet of siT?(li+2) having a value of 0.

P: (KIP-S) number of octet having a value of 0 (S=sum{siT', i=1, KSP}), in which the information block is configured in a manner of generating the information payload by dividing a result from that P is connected after Li, Ri, and Pi are connected with respect to i=1, 2, . . . , KSP, by a continuous T interval.

If the fec_coding_structure_for_fec_flow_i according to the embodiment of the present invention is one-stage coding structure b001 or b010, the embodiment of parity_flow_descriptor is indicated in Table 10.

TABLE 10

```
FCS_i = one stage FEC
parity_flow_descriptor(FCS_i) {
    parity_flow_id_for_fec_flow_i
    fec_code_id_for_parity_flow
    maximum_k
    maximum_p
    length_of_parity_payload
    ibg_mode
    if(ibg_mode = 10) {
        num_of_parity_payloads_per_packet
        num_of_sub_payloads_per_information_payload
    }
}
```

In Table 10, each field means as follows:

parity_flow_id_for_fec_flow_i: an identifier of parity flow configuring ith FEC flow.

fec_code_id_for_parity_flow: an identifier of the FEC code used to generate the parity payload which belongs to the parity flow.

maximum_k: a maximum number of information payloads configuring the information block.

maximum_P: a maximum number of parity payloads configuring the FEC block.

length_of_parity_payload: a length of byte unit of the parity payload. The receiver may determine a buffer size necessary for FEC-decoding three fields, i.e., the maximum_k, the maximum_p, length_of_parity_payload.

ibg_mode: indicates a mode (algorithm) for use in a generation of information block.

b00: ibg_mode0 b01: ibg_mode1 b10: ibg_mode2 b11: ibg_mode3 number_of_parity_payloads_per_packet: the number of parity payloads included one FEC repair packet. It is applicable to only a case of the ibg_mode2.

num_of_sub_payload_per_information_payload: the number of information sub-payloads configuring one information payload. It is applicable to only a case of the ibg_mode2.

If the fec_coding_structure_for_fec_flow_i according to the embodiment of the present invention is two-stage coding structure b011, an embodiment of parity_flow_descriptor is indicated in Table 11.

TABLE 11

```
FCS_i = two stage FEC
parity_flow_descriptor(FCS_i) {
    parity1_flow_id_for_fec_flow_i
    fec_code_id_for_parity1_flow
    maximum_k_for_parity1_flow
    maximum_p_for_parity1_flow
    parity2_flow_id_for_fec_flow_i
    fec_code_id_for_parity2_flow
    maximum_k_for_parity2_flow
    maximum_p_for_parity2_flow
    num_of_sub_block_per_sourc_block
    length_of_parity_payload
    Ibg_mode
    If(ibg_mode = 10) {
        num_of_parity_payloads_per_packet
        num_of_sub_payloads_per_information_payload
    }
}
```

In Table 11, each field means as follows:
parity flow id_for_fec_flow_i: an identifier of parity flow configuring ith FEC flow.
fec_code_id_for_parity_flow: an identifier of the FEC code used to generate the parity payload which belongs to the parity 1 flow.
maximum_k_for_parity1_flow: the maximum number of information payloads configuring the information block used to generate the parity payload which belongs to the parity 1 flow.
maximum_p_for_parity_flow: the maximum number of parity payloads configuring the FEC block, including the parity payloads which belong to the parity 1 flow.
parity2_flow_id_for_fec_flow_i: an identifier of parity2 flow configuring ith FEC flow.
fec_code_id_for_parity2_flow: an identifier of the FEC code used to generate the parity payload which belongs to the parity2_flow.
maximum_k_for_parity2_flow: the maximum number of information payloads configuring the information block used to generate the parity payload which belongs to the parity2_flow.
maximum_p_for_parity2_flow: the maximum number of parity payloads configuring the FEC block including the parity payloads which belong to the parity2_flow.
num_of_sub_block_per_source_block: indicating two-stage coding structure by using the number of source sub-blocks configuring one source block.
length_of_parity_payload: a length of byte unit of the parity payload.
ibg_mode: indicating a mode (algorithm) used for generating information block.
b00: ibg_mode0
b01: ibg_mode2
b10: ibg_mode2
b11: ibg_mode3
num_of_parity_payloads_per_packet: the number of parity payloads included in one FEC repair packet. The num_of_parity_payloads_per_packet is applicable to only case of ibg_mode2.
num_of_sub_payload_per_information_payload: the number of information sub-payloads configuring one information payload. The num_of_sub_payload_per_information_payload is applicable to only a case of ibg_mode2.

An embodiment of parity_flow_descriptor when fec_coding_structure_for_fec_flow_i according to the embodiment of the present invention is an LA-FEC coding structure b100 is indicated in Table 12. In Table 12 and the description thereof, a BL parity flow refers to a parity flow which is generated to protect a base layer of an LA-FEC, an EL parity flow refers to a parity flow which is generated to simultaneously protect the base layer of the LA-FEC and an enhancement layer.

TABLE 12

```
FCS_I = two stage FEC
Parity flow descriptor(FCS_i){
    BL_parity_flow_id_for_fec_flow_i
    fec_code_id_for_BL_parity_flow
    maximum_k_for_BL_parity_flow
    maximum_p_for_BL_parity_folw
    EL_parity_flow_id_for_fec_flow_i
    fec_code_id_for_EL_parity_flow
    maximum_k_for_EL_parity_flow
    maximum_p_for_El_parity_flow
    length_of_parity_payload
    ibg_mode
    if(ibg_mode = 10){
        num_of_parity_payloads_per_packet
        num_of_sub_payloads_per_infomiation_payload
    }
}
```

In Table 12, each field means as follows:
BL_parity_flow_id_for_fec_flow_i: an identifier of a BL parity flow configuring ith FEC flow.
fec_code_id_for_BL_parity_flow: an identifier of the FEC code used to generate the parity payload which belongs to the BL parity flow.
maximum_k_for_BL_parity_flow: the maximum number of information payloads configuring the information block used to generate the parity payload which belongs to the BL parity flow.
maximum_p_for_BL_parity_flow: the maximum number of parity payloads configuring the FEC block including the parity payloads which belongs to the BL parity flow.
EL_parity_flow_id_for_fec_flow_i: an identifier of an EL parity flow configuring ith FEC flow.
fec_code_id_for_EL_parity_flow: an identifier of the FEC code used to generate the parity payload which belongs to the EL parity flow.
maximum_k_for_EL_parity_flow: the maximum number of information payloads configuring the information block used to generate the parity payload which belongs to the EL parity2_flow.
maximum_p_for_EL_parity_flow: the maximum number of parity payloads configuring the FEC block including the parity payloads which belongs to the EL parity flow.
length_of_parity_payload: a length of byte unit of the parity payload.
ibg_mode: indicating a mode (algorithm) used for generating an information block.
b00: ibg_mode0
b01: ibg_mode1
b10: ibg_mode2
b11: ibg_mode3
num_of_parity_payloads_per_packet: the number of parity payloads included in one FEC repair packet. The num_of_parity_payload_per_packet is applicable to only a case of ibg_mode2.
num_of_sub_payload_per_information_payload: the number of information sub-payloads configuring one information payload. The num_of_sub_payload_per_information payload is applicable to only a case of ibg_mode2.

In the MMT flow and the method of configuring the FEC flow according to the embodiment of the present invention, an MMT packet e is configured of three assets.

Video asset (ID 0)
Audio asset (ID 1)
File asset (ID 2)

Figure 17:
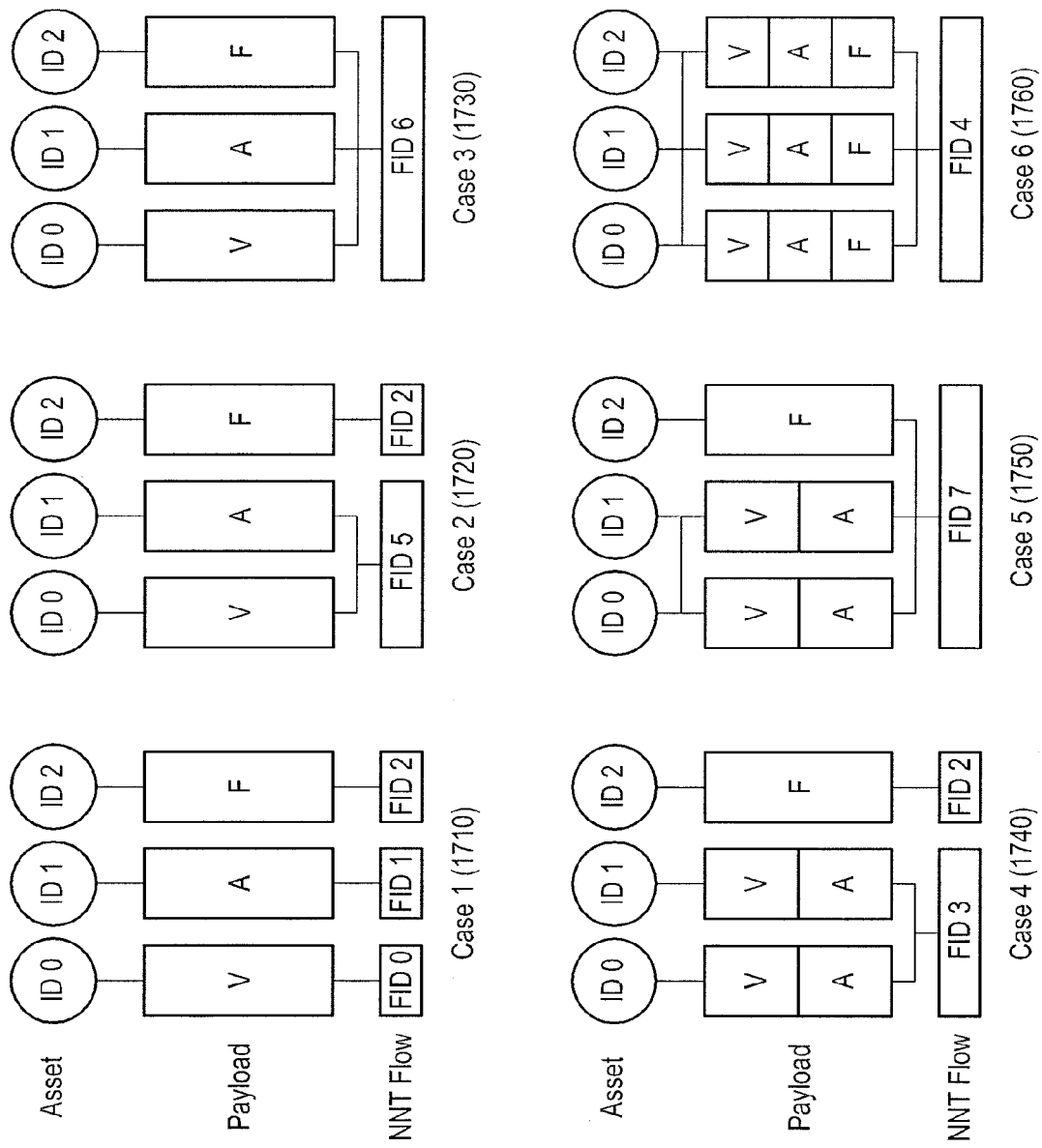
FIG. 17 is a view illustrating an MMT flow according to another embodiment of the present invention.

FIG. 17 is a view illustrating an MMT flow according to another embodiment of the present invention.

Here, the MMT flow refers to a sequence of the MMT payloads if the source payload is the MMT payload, and refers to a sequence of the MMT packets if the source payload is the MMT packet. Each MMT asset is configured of one or more MPUs, and each MPU is divided into a unit of data, based on a maximum transport unit size, having a predetermined size for a delivery. A payload header is added to each data unit, which is packaged into the MMT payload, and then a sequence of the MMT payloads for the MMT asset is configured.

Further, a sequence of the MMT packets is configured by adding an MMT packet header to each MMT payload. In each sequence, a compressed asset ID value of an asset ID corresponding to the sequence is stored in the MMT payload header or the MMT packet header, and information on an asset ID and the compressed asset ID is delivered to the receiving end as an asset message. Therefore, the receiving end may distinguish the MMT payloads or the MMT packets which store data of a corresponding asset from a compressed asset ID value included in the asset message and the MMT payload header or the MMT packet header.

Case 1 (1710): one MMT flow is configured for each of an audio asset, a video asset, and a file asset.

Case 2 (1720): one MMT flow is configured for the audio asset and the video asset, and another MMT flow is configured for the file asset.

Case 3 (1730): one MMT flow is configured for the audio asset, the video asset, and the file asset.

Case 4 (1740): if the audio asset and the video asset are multiplexed, one MMT flow is configured for the audio asset and the video asset, and another MMT flow is configured for the file asset.

Case 5 (1750): one MMT flow is configured for the multiplexed audio/video asset and the file asset.

Case 6 (1760): if the audio asset, the video asset, and the file asset are multiplexed, one MMT flow is configured for the audio asset, the video asset, and the file asset.

In FIG. 17, a plurality of MMT assets is multiplexed in the MMT payload end, and one MMT payload includes data from a plurality of MMT assets. If the multiplexing is performed in the MMT packet end, although it is not shown in FIG. 17, one MMT packet does not include data from a plurality of MMT assets, but only data from one MMT asset.

Here, the multiplexing means that the sequences of the MMT packets from a plurality of MMT assets are mixed to configure a sequence of one MMT packet. That is, the multiplexing at the MMT packet end means that the MMT payload sequence for the video asset and the MMT payload sequence for the audio asset are mixed with each other to configure the MMT payload sequence and then the MMT packet header is added to each MMT payload to configure the MMT packet sequence, or the MMT packet sequence for the video asset and the MMT packet sequence for the audio asset are mixed with each other to configure one MMT packet sequence.

With respect to the Case 1 1710, the Case 2 1720, the Case 3 1730, the Case 4 1740, the Case 5 and the Case 6 1760 shown in FIG. 17, the FEC flow may be configured as follows:

1. Case 1 1710

Case 1-1: one FEC flow is configured for three assets. This means that after three MMT assets configure one source flow and an FEC encoding is performed to deliver the FEC protected source flow, a parity flow is generated to configure and deliver one FEC flow. If the source payload of the source flow is the MMT packet and is protected by two-stage FEC coding structure b011, two parity flows are generated. An embodiment of the FEC message on the FEC flow descriptor as indicated in Table 9 is as follows:

protection_mode=b0: to indicate which MMT packet is protected (if this field has a mode in which only the MMT packet is protected, this field is not necessary.)

number_of_fec_flows=0x01: to indicate the number of FEC flows.

fec_flow_id_for_fec_flow=0x01: to indicate the identifier of the FEC flow.

source_flow_id_for_fec_flow=0x01: to indicate the identifier of the source flow.

number_of_assets=0x03: to indicate the number of MMT assets which the source flow is composed of.

1$^{st}$ asset_id=0x00000000: to indicate the identifier of the MMT asset (Video)

1$^{st}$ short_asset_id=0x0000: to indicate the compressed identifier of the MMT asset (Video) (On an MMT packet stream for the video MMT assets, the identical value (0x0000) is stored in the compressed asset ID field of each MMT packet header, and it is indicated that the MMT packet is a packet for the video.)

error_resiliency=b1: to indicate lossy of the MMT asset (Video)

delay_correlation_indicator=b1: to indicate which the MMT asset (Video) is synchronized with other MMT assets which has delay_correlation_indicator=b1.

2$^{nd}$ asset_id=0x00000001: to indicate the identifier of the MMT asset (Audio)

2$^{nd}$ short_asset_id=0x0001: to indicate the compressed identifier of the MMT asset (Audio) (On the MMT packet stream for the Audio MMT assets, the identical value (0x0001) is stored in the compressed asset ID field of each MMT packet header, and it is indicated that the MMT packet is a packet for the audio.)

error_resiliency=b1: to indicate lossy of the MMT asset (Audio)

delay_correlation_indicator=b1: to indicate which the MMT asset (Audio) is synchronized with other MMT assets which has delay_correlation_indicator=b1.

3$^{th}$ asset_id=0x00000002: to indicate the identifier of the MMT asset (File)

3$^{th}$ short_asset_id=0x0002: to indicate the compressed identifier of the MMT asset (File) (On an MMT packet stream for the File MMT assets, the identical value (0x0000) is stored in the compressed asset ID field of each MMT packet header, and it is indicated that the MMT packet is a packet for the file.)

error_resiliency=b0: to indicate lossy of the MMT asset (File)

delay_correlation_indicator=b0: to indicate which the MMT asset (File) is not synchronized with other MMT assets.

fec_coding_structure_for_fec_flow=b011: to indicate two-stage FEC coding structure.

Parity_flow_descriptor( ) { parity 1_flow_id_for_fec_flow=0x0003: to indicate the identifier of parity flow which is generated by FEC 1 encoder (On an MMT packet stream for the parity flow, the identical value (0x0003) is stored in the compressed asset ID field of each MMT packet header, and it is indicated that the MMT packet is a packet for the parity 1 flow.)

fec_code_id_for_parity flow=0x0001: to indicate the identifier of the FEC 1 code.

maximum_k_for_parity1_flow=0x000008: to indicate the maximum number of Information payloads for sub-block=200.

maximum_p_for_parity1_flow=0x000028: to indicate the maximum number of parity payloads for parity block=40.

parity 2_flow_id_for_fec_flow=0x0004: to indicate the identifier of parity flow which is generated by FEC 2 encoder (On an MMT packet stream for the parity flow, the identical value (0x0004) is stored in the compressed asset ID field of each MMT packet header, and it is indicated that the MMT packet is a packet for the parity 2 flow.)

fec_code_id_for_parity2_flow=0x0002: to indicate the identifier of the FEC 2 code.

maximum_k_for_parity2_flow=0x001900: to indicate the maximum number of Information payloads for source block=6400.

maximum_p_for_parity2_flow=0x000500: to indicate the maximum number of parity payloads for parity2 block=1280.

number_of_sub_block_per_source_block=0x20: to indicate the number of sub-blocks per Source block.

length_of_parity_payload=0x0400: to indicate the size (in bytes) of parity payload=1024.

ibg_mode=bO1: to indicate ibg_mode1

Case 1-2: one FEC flow for an audio asset and a video asset and another FEC flow for a file asset are configured (two FEC flows). This means that one source flow is configured of the audio and video assets, and an FEC protection flow or another source flow is configured of the file asset, thereby configuring two source flows. An FEC encoding for each source flow is performed to deliver the FEC protection, and then a parity flow is generated to configure the FEC flow. This means that one FEC flow for the audio asset and the video asset and another FEC flow for the file asset, i.e., two FEC flows are delivered. When the source payload of the source flow is the MMT packet and is protected by one-stage FEC coding structure b001 or b010, one parity flow is generated. An embodiment of the FEC message on the FEC_flow_descriptor as indicated in Table 9 will be described below.

protection_mode=b0: to indicate which MMT packet is protected (If this field has a mode in which only the MMT packet is protected, this field is not necessary.)

number_of_fec_flows=0x02: to indicate the number of FEC flows.

*** Start for the first FEC flow *** fec_flow_id_for_fec_flow=0x01: to indicate the identifier of the FEC flow for video and audio MMT assets.

source_flow_id_for_fec_flow=0x01: to indicate the identifier of the source flow.

number_of_assets=0x02: to indicate the number of MMT assets which the source flow is composed of.

$1^{st}$ asset_id=0x00000000: to indicate the identifier of the MMT asset (Video)

$1^{st}$ short_asset_id=0x0000: to indicate the compressed identifier of the MMT asset (Video) (On an MMT packet stream for the video MMT assets, the identical value (0x0000) is stored in the compressed asset ID field of each MMT packet header, and it is indicated that the MMT packet is a packet for the video.)

error_resiliency=b1: to indicate lossy of the MMT asset (Video)

delay_correlation_indicator=b1: to indicate which the MMT asset (Video) is synchronized with other MMT assets which has delay_correlation_indicator=b1.

$2^{nd}$ asset_id=0x00000001: to indicate the identifier of the MMT asset (Audio)

$2^{nd}$ short_asset_id=0x0001: to indicate the compressed identifier of the MMT asset (Audio) (On the MMT packet stream for the audio MMT assets, the identical value (0x0001) is stored in a compressed asset ID field of each MMT packet header so as to indicate that the MMT packet is a packet for the audio.)

error_resiliency=b1: to indicate lossy of the MMT asset (Audio)

delay_correlation_indicator=b1: to indicate which the MMT asset (Audio) is synchronized with other MMT assets which has delay_correlation_indicator=b1.

fec_coding_structure_for_fec_flow=b001: to indicate one stage FEC coding structure (Case 1).

Parity_flow_descriptor( ){ parity_flow_id_for_fec_flow=0x0003: to indicate the identifier of parity flow which is generated by FEC encoder (On the MMT packet stream for the parity flow, the identical value (0x0003) is stored in the compressed asset ID field of each MMT packet header so that it is indicated that the MMT packet is a packet for the parity flow.)

fec_code_id_for_parity_flow=0x0001: to indicate the identifier of the FEC code.

maximum_k_for_parity1_flow=0x000008: to indicate the maximum number of Information payloads for sub-block=200.

maximum_p_for_parity1_flow=0x000028: to indicate the maximum number of parity payloads for parity block=40.

length_of_parity_payload=0x0400: to indicate the size (in bytes) of parity payload=1024.

ibg_mode=b01: to indicate ibg_mode1

*** End for the first FEC flow ***

*** Start for the first FEC flow *** fec_flow_id_for_fec_flow=0x02: to indicate the identifier of the FEC flow for file MMT asset.

source_flow_id_for_fec_flow=0x02: to indicate the identifier of the source flow.

number_of_assets=0x01: to indicate the number of MMT assets which the source flow is composed of.

asset_id=0x00000002: to indicate the identifier of the MMT asset (File)

short_asset_id=0x0002: to indicate the compressed indentifier of the MMT asset (File) (On the MMT packet stream for the file MMT assets, the identical value (0x0002) is stored in the compressed asset ID field of each MMT packet header so that it indicated that the MMT packet is a packet for the file.)

error_resiliency=b0: to indicate lossless of the MMT asset (File)

delay_correlation_indicator=b0: to indicate which the MMT asset (File) is not synchronized with other MMT assets.

fec_coding_structure_for_fec_flow=b010: to indicate one stage FEC coding structure (Case 2).

Parity_flow_descriptor( ){ parity2_flow_id_for_fec_flow=0x0004: to indicate the identifier of parity flow which is generated by FEC 2 encoder (On an MMT packet stream for the parity flow, the identical value (0x0004) is stored in the compressed asset ID field of each MMT packet header, and it is indicated that the MMT packet is a packet for the parity 2 flow.)

fec_code_id_for_parity2_flow=0x0002: to indicate the identifier of the FEC 2 code.

maximum_k_for_parity_flow=0x001900: to indicate the maximum number of Information payloads for source block=6400.

maximum_p_for_parity1_flow=0x000500: to indicate the maximum number of parity payloads for parity block=1280.

length_of_parity_payload=0x0400: to indicate the size (in bytes) of parity payload=1024.

ibg_mode=b00: to indicate ibg_mode0

*** End for the second FEC flow ***

Case 1-3: each asset configures one FEC flow (three FEC flows.) This means that one source flow is configured of each asset, and a parity flow is generated by an FEC encoding to FEC-protect and deliver the source flow, and delivered to the FEC flow, i.e., three FEC flows such as one FEC flow for the audio asset, another FEC flow for the video asset, and still another FEC flow for the file asset.

2. Case 2

Case 2-1: one FEC flow for an audio/video asset and a file asset is configured (identical to Case 1-1).

Case 2-2: one FEC flow for the audio/video asset and another FEC flow for the file asset are configured (two FEC flows) (identical to Case 1-2).

3. Case 3

Case 3-1: one FEC flow for the audio/video/file asset is configured (identical to Case 1-1).

4. Case 4

Case 4-1: one FEC flow for a multiplexed audio/video asset and the file asset is configured.

Case 4-2: one FEC flow for the multiplexed audio/video asset and another FEC flow for the file asset are configured.

5. Case 5

Case 5-1: one FEC flow for the multiplexed audio/video asset and the file asset is configured.

6. Case 6

Case 6-1: one FEC flow for the multiplexed audio/video asset and the file asset is configured.

Figure 18:
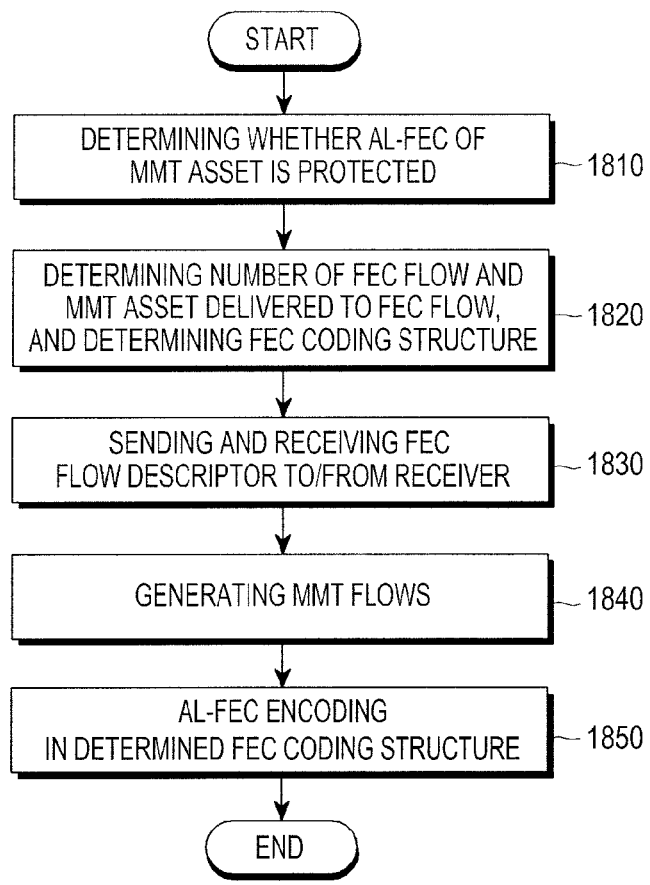
FIG. 18 is a flowchart illustrating an operation of a sender according to the embodiment of the present invention.

FIG. 18 is a flowchart illustrating an operation of the sender according to the embodiment of the present invention.

The sender of the present invention includes a sending unit and a receiving unit for sending and receiving data to/from the receiver, a controller for wholly controlling the sending unit which determines an MMT asset, an FEC flow, an FEC coding structure and the like, and a coding unit for performing a generation of a source flow, an AL-FEC encoding, and the like.

An operation of the sender will be described with reference to FIG. 18. The sender determines whether an MMT asset to be delivered in the MMT package is protected with an AL-FEC in step 1810. Then, the sender determines quantity of FEC flows which one or more MMT assets to be delivered in the MMT package are divided into, determines the MMT asset to be delivered to each FEC flow, and determines any of one stage FEC coding structure or two stage FEC coding structure as the FEC coding structure based on QoS of the MMT asset to be delivered to each flow in step 1820.

Further, the sender sends and receives the FEC flow descriptor for one or more MMT assets to be delivered each FEC flow to/from the receiver through the C. Layer in step 1830, and divides the MMT assets to be delivered by a unit for delivering the MMT assets to be delivered, so as to generate the MMT flows in step 1840. In this event, the D. Layer header stores and delivers an asset ID information field which belongs to the data of the payload. In the case where the payload is multiplexed by data of various assets, an asset ID information field for each data is stored. When the MMT flows are generated, the AL-FEC encoding of the MMT flows is performed in the FEC coding structure determined for each FEC flow for the MMT assets to be delivered in step 1850.

For example, if the MMT assets to be delivered to the FEC flow includes the audio/video asset and the file asset and have different QoSs, that is, the audio/video assets allows a delay less than 200 ms and a loss while if the file asset does not allow a loss regardless of the delay, the MMT flow configured of the audio, video and file assets is encoded by the two-stage FEC coding structure. That is, a source block having a sufficient magnitude is configured for the encoding by the two-stage FEC coding structure, and is divided into m small sub-blocks. At this time, each sub-block is configured to have a small enough size to satisfy a delay characteristic of the audio/video assets, and the FEC encoding for the sub-block is performed to generate the FEC 1 block. Then, the FEC 2 coding for all the source block is performed to satisfy a loss characteristic of the file asset, thereby achieving the two-stage FEC coding.

Figure 19:
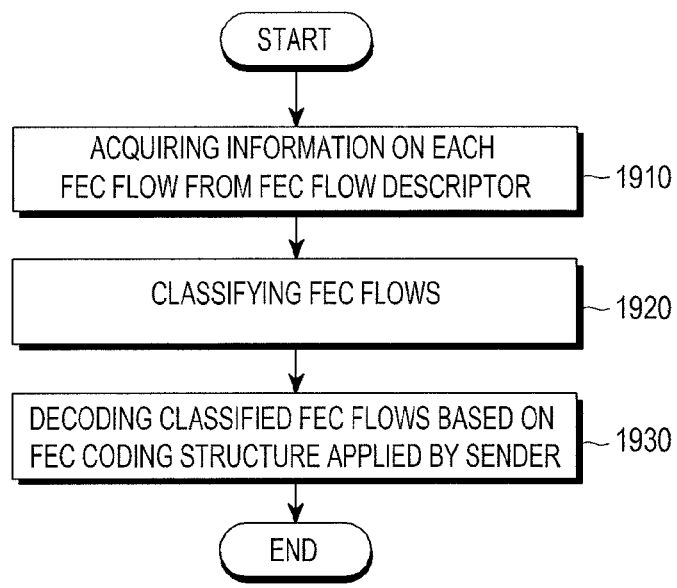
FIG. 19 is a flowchart illustrating an operation of a receiver according to the embodiment of the present invention.

FIG. 19 is a flowchart illustrating an operation of the receiver according to the embodiment of the present invention.

The receiver of the present invention includes a sending unit and a receiving unit for sending and receiving data to/from the sender, a controller for wholly controlling the receiver to identify the FEC coding structure and to perform the classification of the FEC flow, and a decoding unit for performing a decoding.

The operation of the receiver will be described with respect to FIG. 19. The receiver identifies which assets are delivered to each FEC flow from the FEC flow descriptor communicating with the sender through the C. Layer, and which condition at the error resiliency characteristic or QoS of the assets is in. Further, the receiver identifies a kind of which the FEC coding structure applied to each FEC flow is in step 1910. Then, the receiver determines whether the D. Layer header of the received packets storing an FEC flow label is delivered. If it is determined that the D. Layer header of the received packets storing the FEC flow label is delivered, each FEC flow is classified from the FEC flow label, or by identifying asset IDs of data delivered by a corresponding packet from the asset ID information field of the D. Layer header in step 1920. When the FEC flow is classified, an FEC decoding for each classified FEC flow is performed based on an FEC coding structure applied by the sender in step 1920.

At this time, if the FEC coding structure applied by the sender is a two-stage FEC coding structure, various FEC decoding methods may be performed according to an error resiliency characteristic or QoS of the assets delivered to the FEC flow. For example, if audio, video, and file assets are delivered to one FEC flow in a state that they are encoded in a two stage FEC coding structure, and QoS of the audio and video assets allows a low delay and loss while QoS of the file asset does not allow a loss regardless of the delay, the FEC decoder recovers the audio/video data with a low delay through the FEC 1 decoding, and when the FEC 1 decoding fails, the file asset is repaired through the FEC 2 decoding.

On the other hand, in the present invention, the C. layer includes a C.1 layer including configuration information and a C.2 layer controlling a delivery, and D. Layer is a D.1 layer for generating an MMT payload, or a D.2 layer for generating an MMT transport packet.

Further, in this specification, the source payload for the FEC encoding is described as a payload of the MMT payload format, but the present invention is not limited thereto, but may include all of the cases where the source payload is an MMT payload format generated in the source payload D.1 layer, a case where the source payload is an MMT transport format to which the D.2 header, and a case where the source payload is an MMT payload format which is configured to include information of the D.1 header or the D.2 header which is required to be protected. Furthermore, descriptors used in the present invention are merely used as an example of a configuration for a control message related to the C layer FEC. Accordingly, the present invention is not limited thereto and the content of the descriptors may be delivered in any form.

Although an exemplary embodiment is described in the detailed description of the present invention, the present invention may be modified in various forms without departing from the scope of the present invention. Therefore, the scope of the present invention is not limited to the embodiment as described above, and should be defined by the claims and the equivalents of the claims.

The invention claimed is:

1. A method for transmitting a packet in a communication system, the method comprising:
   determining at least one motion picture experts group (MPEG) media transport (MMT) asset to be protected by a forward error correction (FEC);
   determining a number of FEC source flows comprising MMT packets carrying the MMT asset;
   identifying an FEC configuration information based on an FEC coding structure and an FEC code to be applied to the FEC source flows;
   generating repair symbols composing at least one FEC repair flow by performing an FEC coding for the FEC source flows by using the FEC code;
   generating FEC repair packets corresponding to each of the repair symbols, and transmitting the FEC repair packets to a receiving entity; and
   transmitting an FEC message including the FEC configuration information to the receiving entity.

2. The method of claim 1, wherein the FEC message comprises at least one of:
   information indicating whether there is at least one source flow applied to the FEC coding;
   information on an FEC flow descriptor indicating information on the FEC flow; and
   information on a length of the FEC flow descriptor.

3. The method of claim 2, wherein the FEC flow descriptor comprises at least one of:
   information on a source flow identifier for identifying an FEC source flow;
   information on the FEC flow identifier for identifying an FEC encoded flow;
   information on a number of FEC encoded flows;
   information on a number of assets that belongs to a same FEC source flow; and
   information indicating an applied FEC coding structure for an associated FEC source flow.

4. The method of claim 2, wherein the FEC flow descriptor comprises at least one of:
   information for indicating a type of mode used for generating a source symbol block;
   information on a length of a repair symbol;
   information on a number of repair symbol carried in an FEC repair packet; and
   information on a number of symbol element consisting a source symbol.

5. The method of claim 2, wherein, if the FEC coding structure is a one stage FEC coding structure, the FEC flow descriptor comprises at least one of:
   information on a repair flow identifier identifying FEC repair flow;
   information on an applied FEC code for an associated FEC repair flow;
   information on a maximum k for indicating a maximum allowed number of source symbols in a source symbol block for the associated FEC repair flow; and
   information on a maximum p for indicating a maximum allowed number of repair symbols in a repair symbol block for the associated FEC repair flow.

6. The method of claim 2, wherein, if the FEC coding structure is a two stage FEC coding structure, the FEC flow descriptor comprises at least one of:
   information on a number of source subblocks consisting of a source packet block for the two stage FEC coding structure;
   information on a repair flow identifier identifying FEC repair flow;
   information on an applied FEC code for an associated FEC repair flow;
   information on a maximum k for indicating a maximum allowed number of source symbols in a source symbol block for the associated FEC repair flow; and
   information on a maximum p for indicating a maximum allowed number of repair symbols in a repair symbol block for the associated FEC repair flow.

7. The method of claim 2, wherein, if the FEC coding structure is a layer-aware FEC coding structure, the FEC flow descriptor comprises at least one of:
   information on an applied FEC code for an associated FEC repair flow;
   information on a repair flow identifier identifying FEC repair flow;
   information on a maximum k for indicating a maximum allowed number of source symbols in a source symbol block for the associated FEC repair flow; and
   information on a maximum p for indicating a maximum allowed number of repair symbols in a repair symbol block for the associated FEC repair flow.

* * * * *

UNITED STATES PATENT AND TRADEMARK OFFICE
CERTIFICATE OF CORRECTION

PATENT NO. : 9,578,292 B2  
APPLICATION NO. : 14/360480  
DATED : February 21, 2017  
INVENTOR(S) : Sung-Hee Hwang et al.

Page 1 of 1

It is certified that error appears in the above-identified patent and that said Letters Patent is hereby corrected as shown below:

In the Claims

Regarding Claim 1, delete the word "comprising" in Column 31 Line 31 and insert the word --for--.

Signed and Sealed this  
Eleventh Day of April, 2017

Michelle K. Lee  
*Director of the United States Patent and Trademark Office*